(12) United States Patent
Song et al.

(10) Patent No.: US 10,685,973 B2
(45) Date of Patent: Jun. 16, 2020

(54) VERTICAL MEMORY DEVICE

(71) Applicant: Samsung Electronics Co., Ltd., Suwon-si, Gyeonggi-do (KR)

(72) Inventors: Moon Kyu Song, Goyang-si (KR); Ki Yoon Kang, Seoul (KR); Jae Hoon Jang, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 53 days.

(21) Appl. No.: 15/942,683

(22) Filed: Apr. 2, 2018

(65) Prior Publication Data

US 2019/0067321 A1 Feb. 28, 2019

(30) Foreign Application Priority Data

Aug. 30, 2017 (KR) .................. 10-2017-0110403

(51) Int. Cl.
| | | |
|---|---|---|
| *H01L 27/11582* | (2017.01) | |
| *H01L 27/11565* | (2017.01) | |
| *H01L 27/1157* | (2017.01) | |
| *H01L 27/11575* | (2017.01) | |
| *H01L 27/11556* | (2017.01) | |
| *H01L 27/11578* | (2017.01) | |
| *H01L 27/11551* | (2017.01) | |
| *H01L 23/00* | (2006.01) | |

(52) U.S. Cl.
CPC ...... *H01L 27/11582* (2013.01); *H01L 23/562* (2013.01); *H01L 27/1157* (2013.01); *H01L 27/11551* (2013.01); *H01L 27/11556* (2013.01); *H01L 27/11565* (2013.01); *H01L 27/11575* (2013.01); *H01L 27/11578* (2013.01)

(58) Field of Classification Search
CPC ........ H01L 27/11551; H01L 27/11556; H01L 27/1157; H01L 27/11575; H01L 27/11578; H01L 27/11582
USPC .................................................. 257/324, 326
See application file for complete search history.

(56) References Cited

U.S. PATENT DOCUMENTS

| | | |
|---|---|---|
| 9,245,839 B2 | 1/2016 | Chae et al. |
| 9,570,463 B1 | 2/2017 | Zhang et al. |
| 9,576,967 B1 | 2/2017 | Kimura et al. |
| (Continued) | | |

FOREIGN PATENT DOCUMENTS

| | | |
|---|---|---|
| KR | 10-2000-0040667 A | 7/2000 |
| KR | 10-2011-0015337 A | 2/2011 |

*Primary Examiner* — Matthew E Warren
(74) *Attorney, Agent, or Firm* — Harness, Dickey & Pierce, P.L.C.

(57) ABSTRACT

A vertical memory device includes a substrate including a cell array region and a connection region adjacent to the cell array region, a plurality of gate electrode layers stacked on the cell array region and the connection region of the substrate, a channel structure on the cell array region and extending in a direction perpendicular to an upper surface of the substrate while penetrating through the plurality of gate electrode layers, a dummy channel structure on the connection region and extending in the direction perpendicular to the upper surface of the substrate while penetrating through at least a portion of the plurality of gate electrode layers, and a support insulating layer between a portion of the plurality of gate electrode layers and the dummy channel structure. The plurality of gate electrode form a stepped structure on the connection region.

20 Claims, 24 Drawing Sheets

(56) References Cited

U.S. PATENT DOCUMENTS

| | | |
|---|---|---|
| 9,627,403 B2 | 4/2017 | Liu et al. |
| 10,141,331 B1* | 11/2018 | Susuki .............. H01L 27/11582 |
| 10,403,719 B2* | 9/2019 | Choi ................ H01L 27/11556 |
| 2016/0225785 A1* | 8/2016 | Kim .................. H01L 27/11575 |
| 2016/0276361 A1 | 9/2016 | Noda |
| 2017/0062454 A1* | 3/2017 | Lu .................... H01L 21/76877 |
| 2017/0117290 A1 | 4/2017 | Lee et al. |
| 2017/0287926 A1* | 10/2017 | Ariyoshi .......... H01L 27/11582 |

* cited by examiner

VERTICAL MEMORY DEVICE

CROSS-REFERENCE TO RELATED APPLICATION(S)

This application claims priority to Korean Patent Application No. 10-2017-0110403 filed on Aug. 30, 2017 in the Korean Intellectual Property Office, the disclosure of which is incorporated herein by reference in its entirety.

BACKGROUND

1. Field

Inventive concepts relate to a vertical memory device.

2. Description of Related Art

Volumes of electronic products have gradually been reduced, while such electronic products are still used to process high capacity data. Thus, the degree of integration of semiconductor memory devices used in such electronic products needs to be increased. In a method in which the degree of integration of semiconductor memory devices may be increased, a vertical memory device, in which memory cells having a vertical transistor structure, rather than having an existing planar transistor structure, are stacked, has been proposed.

SUMMARY

Inventive concepts relate to a vertical memory device, in which a structural defect may be limited and/or prevented during a replacement process of gate electrode layers.

According to some example embodiments of inventive concepts, a vertical memory device includes a substrate including a cell array region and a connection region adjacent to the cell array region, a plurality of gate electrode layers stacked on the cell array region and the connection region of the substrate, a channel structure on the cell array region, a dummy channel structure on the connection region, and a support insulating layer between a portion of the plurality of gate electrode layers and the dummy channel structure. The plurality of gate electrodes may form a stepped structure on the connection region. The channel structure may extend in a direction perpendicular to an upper surface of the substrate while penetrating through the plurality of gate electrode layers. The dummy channel structure may extend in the direction perpendicular to the upper surface of the substrate while penetrating through at least a portion of the plurality of gate electrode layers.

According to some example embodiments of inventive concepts, a vertical memory device includes a substrate including a cell array region and a connection region adjacent to the cell array region, a lower stacked structure on the substrate and including lower mold insulating layers and lower gate electrode layers alternately stacked on the substrate, an upper stacked structure on the lower stacked structure and including upper mold insulating layers and upper gate electrode layers alternately stacked, a channel structure on the cell array region and penetrating through the upper stacked structure and the lower stacked structure, a dummy channel structure on the connection region and penetrating through the lower stacked structure, and a support insulating layer penetrating through the lower stacked structure and surrounding an outer peripheral surface of the dummy channel structure.

According to some example embodiments of inventive concepts, a vertical memory device includes a substrate including a cell array region and a connection region adjacent to the cell array region, a channel layer on the cell array region and extending in a direction perpendicular to an upper surface of the substrate, a dummy channel layer on the connection region and extending in the direction perpendicular to the upper surface of the substrate, a cell epitaxial layer between the channel layer and the substrate, a dummy epitaxial layer between the dummy channel layer and the substrate, and a support insulating layer surrounding an outer peripheral surface of the dummy epitaxial layer and having an upper surface higher than an upper surface of the dummy epitaxial layer. The dummy epitaxial layer may have shape that is different from a shape of the cell epitaxial layer.

BRIEF DESCRIPTION OF DRAWINGS

The above and other aspects and features of inventive concepts will be more clearly understood from the following detailed description, taken in conjunction with the accompanying drawings, in which.

DETAILED DESCRIPTION

Hereinafter, some example embodiments of inventive concepts will be described with reference to the accompanying drawings.

Figure 1:
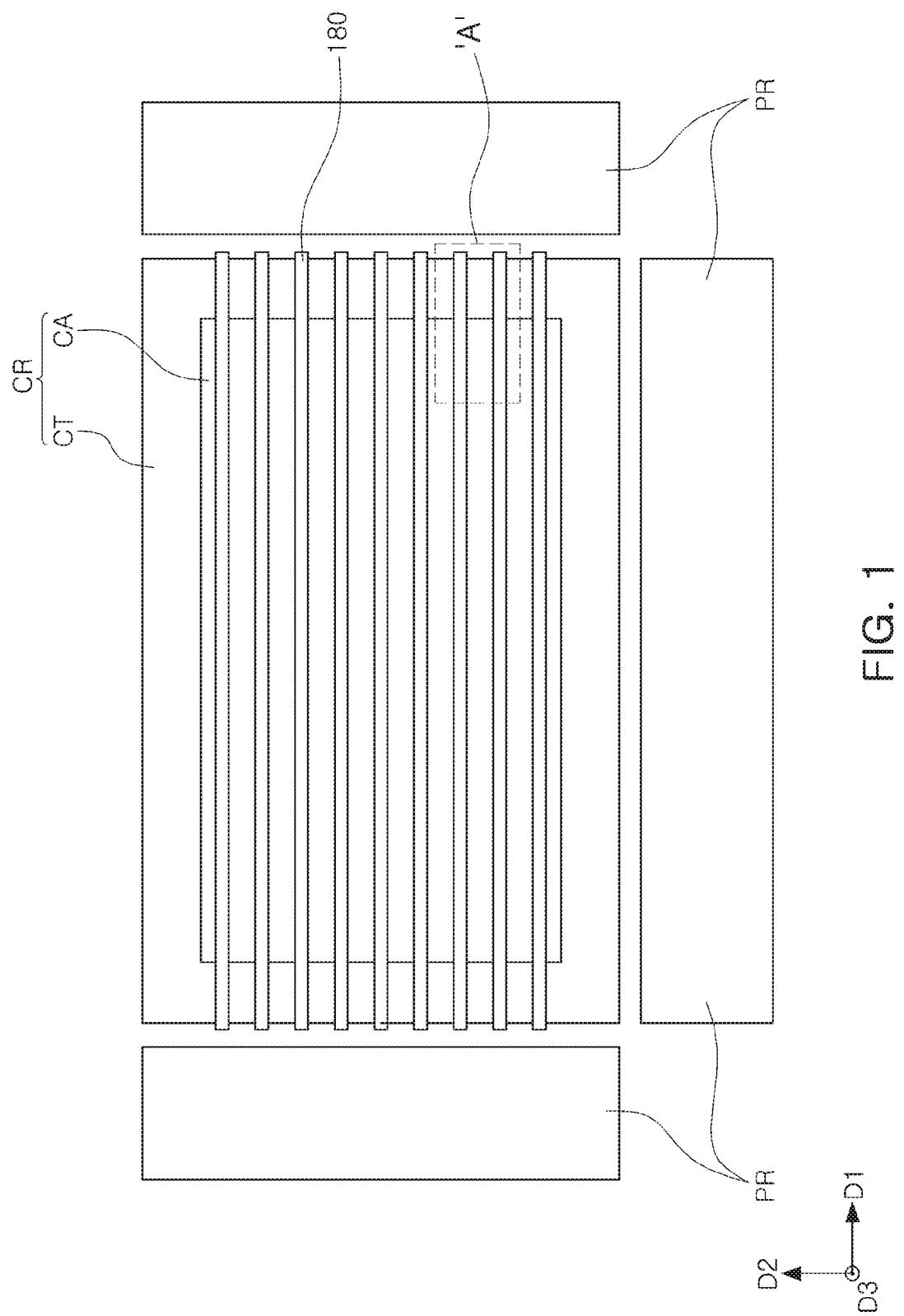
FIG. 1 is a schematic layout diagram of a vertical memory device according to some example embodiments of inventive concepts.

FIG. 1 is a schematic diagram of a vertical memory device according to some example embodiments of inventive concepts.

Referring to FIG. 1, a vertical memory device according to some example embodiments of inventive concepts may include a cell region CR in which a plurality of memory cells are formed, and peripheral circuit regions PR in which peripheral circuits driving the memory cells are formed. A row decoder circuit, a column decoder circuit, a page buffer circuit and the like may be disposed in the peripheral circuit regions PR. FIG. 1 is illustrated by way of example, and the arrangement of the peripheral circuit regions PR is not limited to that shown in the drawing.

A plurality of common source lines 180 extending in a first direction D1 may be disposed in the cell region CR. The common source lines 180 may be referred to as first metal lines. The plurality of common source lines 180 may be arranged to have a desired and/or alternatively predetermined interval therebetween in a second direction D2, intersecting the first direction D1. The cell region CR may be divided into a plurality of regions by the common source lines 180. The cell region CR may include a cell array region CA and a connection region CT surrounding the cell array region CA. The plurality of common source lines 180 may extend in the first direction D1 to be integrated with the cell array region CA and the connection region CT. The number of common source lines 180 illustrated in FIG. 1 is provided by way of example, and thus, is not limited thereto.

Figure 2:
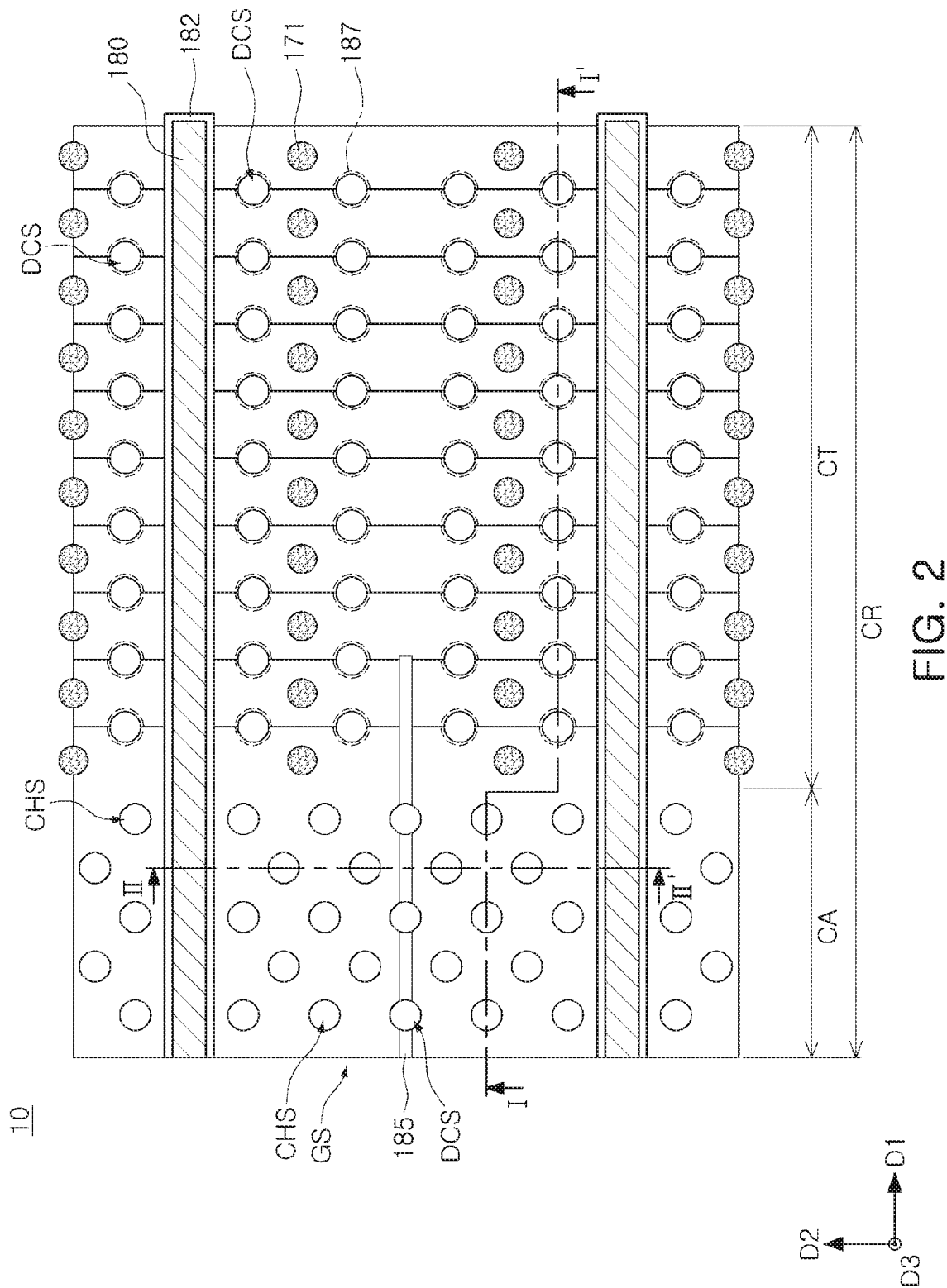
FIG. 2 is a schematic plan view of a vertical memory device according to some example embodiments of inventive concepts.

FIG. 2 is a schematic plan view of a vertical memory device 10 according to some example embodiments of inventive concepts. FIG. 2 illustrates region A of FIG. 1.

Referring to FIG. 2, the vertical memory device 10 according to some example embodiments of inventive concepts may include a cell array region CA in which memory cells are formed, and a connection region CT, connecting gate electrodes of the memory cells to wirings. The cell array region CA and the connection region CT may constitute the cell region CR.

A stacked structure GS extending in the first direction D1 may be disposed in the cell array region CA and the connection region CT. The stacked structure GS may include a plurality of gate electrode layers and a plurality of mold insulating layers alternately stacked on a substrate. The stacked structure GS may be divided into a plurality of regions by the plurality of common source lines 180. Each of the plurality of divided regions of the stacked structure GS may be referred to as a stacked structure GS. The plurality of common source lines 180 may extend continuously in the first direction D1 in the cell array region CA and the connection region CT. The plurality of common source lines 180 may be electrically connected to the substrate. The plurality of common source lines 180 may be formed of a conductive material. For example, the plurality of common source lines 180 may include at least one of a metal (such as tungsten, copper, titanium, aluminum and the like), a doped semiconductor material, or a conductive material (such as a conductive metal nitride film or the like). The plurality of common source lines 180 may be electrically insulated from the gate electrode layers of the stacked structure GS. An insulating layer 182 may be disposed between the plurality of common source lines 180 and the stacked structure GS. The insulating layer 182 may include silicon oxide ($SiO_2$), silicon nitride ($Si_3N_4$), silicon oxynitride (SiON), or a combination thereof.

An insulating layer 185 may be disposed between the common source lines 180. The insulating layer 185 may be disposed in the cell array region CA, and may extend to the connection region CT. A portion of the gate electrode layers disposed in an upper portion of the stacked structure GS, for example, each of two gate electrode layers disposed in an upper portion of the stacked structure GS, may be divided into two regions by the insulating layer 185 (see FIG. 4).

In the cell array region CA, a plurality of channel structures CHS may penetrate through the stacked structure GS to be connected to the substrate. In the connection region CT, a plurality of dummy channel structures DCS may penetrate through the stacked structure GS to be connected to the substrate, and a plurality of contact plugs 171 may be connected to the plurality of gate electrode layers.

In the cell array region CA, the plurality of channel structures CHS may be arranged in a plurality of columns. As illustrated in FIG. 2, the channel structures CHS may be arranged in eight columns between a pair of common source lines 180 by way of example. For example, the channel structures CHS may be disposed in four columns between one common source line 180 and the insulating layer 185. The plurality of channel structures CHS may be disposed in a zigzag form. The arrangement of the plurality of channel structures CHS is not limited to that shown in FIG. 2, and may be variously modified.

The stacked structure GS may be formed to have a stepped structure including a plurality of stepped layers in the connection region CT. The stepped structure may be formed by extending the plurality of gate electrode layers and the plurality of mold insulating layers of the stacked structure GS to different lengths. The plurality of stepped layers may be provided as pad regions in which the plurality of contact plugs 171 are disposed.

The plurality of dummy channel structures DCS may be disposed to be adjacent to ends of the plurality of stepped layers in the connection region CT. Although the plurality of dummy channel structures DCS are illustrated as being arranged in two columns between a pair of common source lines 180 in FIG. 2 by way of example, the arrangement of the dummy channel structures DCS is not limited thereto. For example, a portion of the plurality of dummy channel structures DCS may be disposed adjacently to ends of the plurality of stepped layers, while remaining dummy channel structures may be disposed to be relatively separated from ends of the plurality of stepped layers. In a manner different therefrom, the plurality of dummy channel structures DCS may be spaced apart from ends of the plurality of stepped layers while being disposed in the plurality of stepped layers. The plurality of dummy channel structures DCS of the connection region CT may have a greater pitch or interval therebetween than that of the plurality of channel structures CHS. The pitch may indicate a horizontal distance between centers of adjacent structures in plan view.

The plurality of dummy channel structures DCS may be further disposed in the cell array region CR to penetrate through the insulating layer 185.

The plurality of channel structures CHS may be connected to bit lines to perform reading/writing operations, while the plurality of dummy channel structures DCS may not be connected to the bit lines. Thus, the plurality of dummy channel structures DCS may not provide memory cells, but may serve to support the stacked structure GS in the connection region CT.

In the connection region CT, a plurality of support insulating layers 187 may be disposed in positions overlapping positions of the plurality of dummy channel structures DCS. The plurality of dummy channel structures DCS may penetrate through the plurality of support insulating layers 187, respectively, in the connection region CT.

In some example embodiments, the support insulating layers 187 may be applied to at least a portion of the channel structures CHS. For example, when the channel structures CHS include two or more regions having different pitches, the support insulating layers 187 may be applied to the channel structures CHS in a region having a relatively greater pitch.

Figure 3:
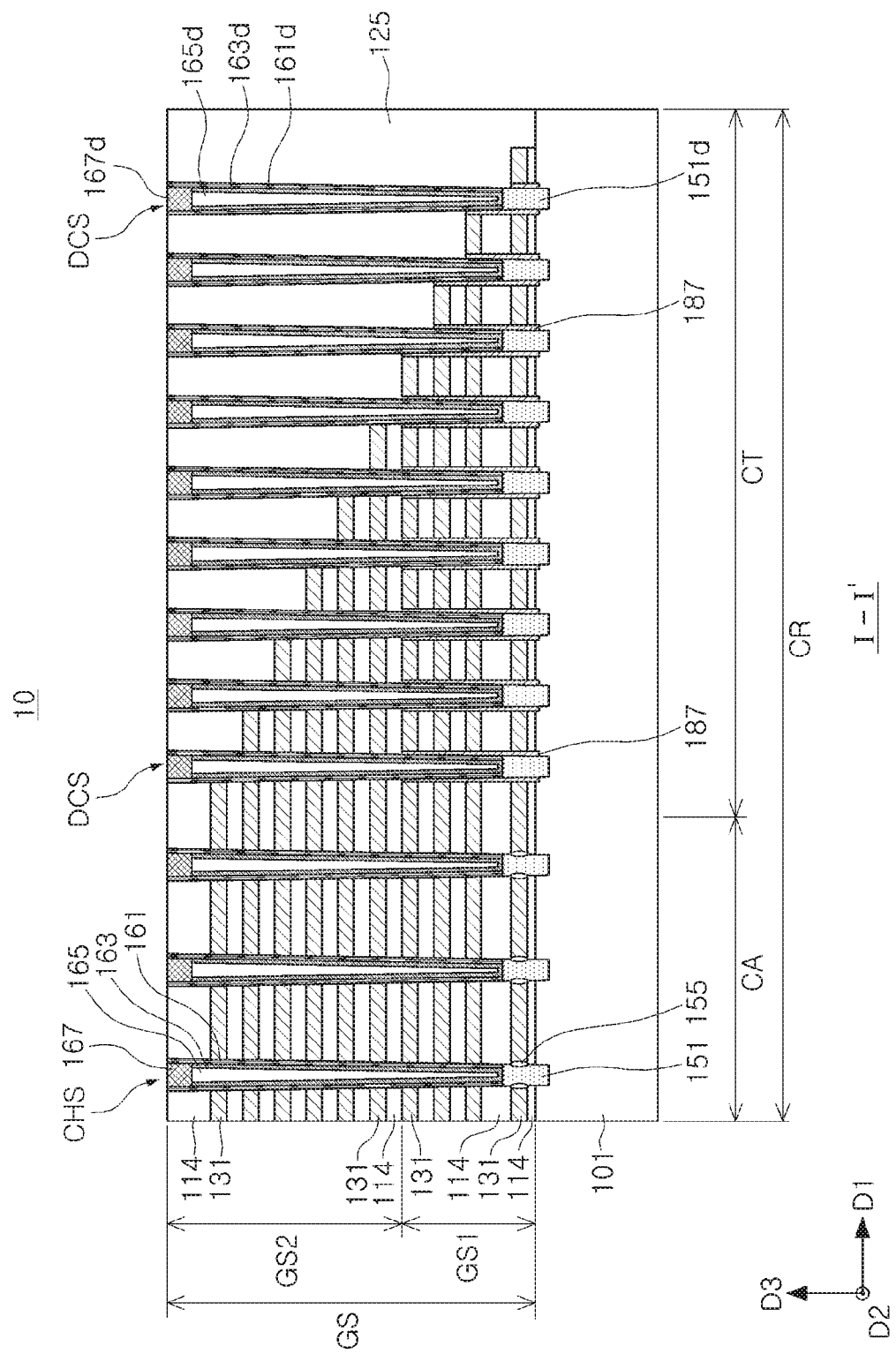
FIGS. 3 to 4 are schematic cross-sectional views of a vertical memory device according to some example embodiments of inventive concepts.
Figure 4:
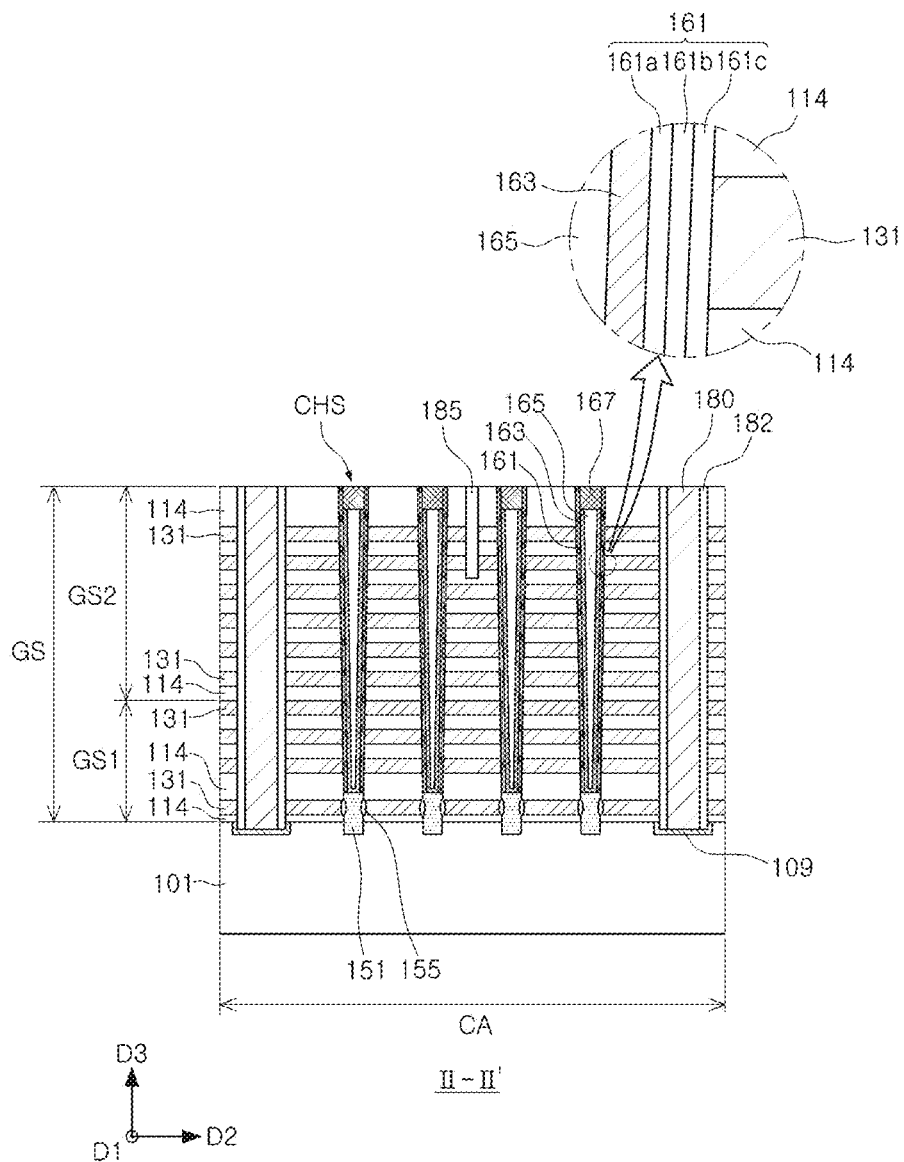

FIG. 3 is a schematic cross-sectional view of a vertical memory device 10, taken along line I-I' of FIG. 2, according to some example embodiments of inventive concepts. FIG. 4 is a cross-sectional view taken along line II-II' of FIG. 2.

Referring to FIGS. 3 and 4, the vertical memory device 10 may include a substrate 101, a stacked structure GS, channel structures CHS, dummy channel structures DCS, a support insulating layer 187, an insulating layer 155, and an interlayer insulating layer 125.

The substrate 101 may include a semiconductor material, such as a group IV semiconductor material, a group III-V compound semiconductor material, or a group II-VI compound semiconductor material. The stacked structure GS may include a plurality of gate electrode layers 131 and a plurality of mold insulating layers 114 alternately stacked on the substrate 101. The plurality of gate electrode layers 131 may be stacked on the substrate 101, to be spaced apart from each other in a third direction D3 perpendicular to an upper surface of the substrate 101. The plurality of gate electrode layers 131 may extend in a first direction D1 and may be disposed in a cell array region CA and a connection region CT. The stacked structure GS may have a stepped structure including a plurality of stepped layers in the connection region CT. The plurality of gate electrode layers 131 may extend to have different lengths in the first direction D1 to form the stepped structure in the connection region CT. The mold insulating layers 114 may also have a stepped structure together with the gate electrode layers 131. The stacked structure GS may include a lower stacked structure GS1 and an upper stacked structure GS2. The upper stacked structure GS2 may be disposed on the lower stacked structure GS1, and may include more gate electrode layers 131 and mold insulating layers 114 than the lower stacked structure GS1. A thickness of the upper stacked structure GS2 may be greater than a thickness of the lower stacked structure GS1.

The gate electrode layers 131 may include a metal material, a metal nitride, a metal silicide material, polycrystalline silicon, or a combination thereof. Examples of the metal material may include tungsten (W), copper (Cu), or aluminum (Al). Examples of the metal silicide may include a silicide material including at least one of cobalt (Co), nickel (Ni), hafnium (Hf), platinum (Pt), tungsten (W), titanium (Ti), or a combination thereof. Examples of the metal nitride may include tungsten nitride (WN), tantalum nitride (TaN), titanium nitride (TiN), or a combination thereof. For example, the gate electrode layers 131 may include tungsten (W) and titanium nitride (TiN). The mold insulating layers 114 may include silicon oxide.

The number of the gate electrode layers 131 is not limited to that shown in FIG. 3. As a storage capacity of the vertical memory device 10 increases, the number of gate electrode layers 131 of the memory cells may be increased. For example, several tens to hundreds of gate electrode layers 131 may be stacked on the substrate 101.

The vertical memory device may include an interlayer insulating layer 125 disposed in the connection region CT and covering a stepped structure of the stacked structure GS. The interlayer insulating layers 125 may include silicon oxide or a low dielectric material. The low dielectric material may be an insulating material having a dielectric constant lower than that of silicon oxide.

A plurality of channel structures CHS penetrating through the stacked structure GS may be disposed in the cell array region CA. For example, in the cell array region CA, the plurality of channel structures CHS may be disposed to penetrate through an upper stacked structure GS2 and a lower stacked structure GS1. In the cell array region CA, the plurality of channel structures CHS penetrating through the plurality of gate electrode layers 131 may be disposed, and in the connection region CT, the plurality of dummy channel structures DCS penetrating through at least one of the upper stacked structure GS2 and the lower stacked structure GS1 may be disposed. The plurality of dummy channel structures DCS penetrating through the stacked structure GS may be disposed in the connection region CT. The plurality of dummy channel structures DCS penetrating through at least one of the plurality of gate electrode layers 131 may be disposed in the connection region CT. A diameter or a width of the plurality of channel structures CHS and a diameter or a width of the plurality of dummy channel structures DCS may be reduced toward the substrate 101.

In the connection region CT, a plurality of support insulating layers 187 may be disposed to penetrate through the lower stacked structure GS1 and to surround outer peripheral (e.g., circumferential) surfaces of the plurality of dummy channel structures DCS. The plurality of dummy channel structures DCS may penetrate through the plurality of support insulating layers 187, respectively. The plurality of support insulating layers 187 may be disposed between a portion of the plurality of gate electrode layers 131 and the plurality of dummy channel structures DCS in the connection region CT. The plurality of support insulating layers 187 may contact the substrate 101. The plurality of support insulating layers 187 may extend from the substrate 101 along the plurality of dummy channel structures DCS. Lower surfaces of the plurality of support insulating layers 187 may be lower than an upper surface of the substrate 101. Lower surfaces of the plurality of dummy channel structures DCS may be lower than the lower surfaces of the plurality of support insulating layers 187. At least a portion of the plurality of support insulating layers 187 may have an upper surface coplanar with an upper surface of any one of the plurality of gate electrode layers. The support insulating layers 187 disposed on an edge of the connection region CT may have an asymmetric structure including portions having different heights measured from an upper surface of the substrate 101. The difference in height may be the same as a distance between upper surfaces of adjacent gate electrode layers 131. A height of a portion of the support insulating layers 187 disposed on an edge of the connection region CT may be lower than a height of the support insulating layers 187 adjacent to the cell array region CA.

Each of the plurality of channel structures CHS may include a cell epitaxial layer 151, a cell gate dielectric layer 161, a cell channel layer 163, an insulating layer 165, and a contact pad 167. The plurality of dummy channel structures DCS may have a structure similar to that of the plurality of channel structures CH. Each of the plurality of dummy channel structures DCS may include a dummy epitaxial layer 151d, a dummy gate dielectric layer 161d, a dummy channel layer 163d, an insulating layer 165d, and a contact pad 167d.

The cell epitaxial layers 151 may be disposed below the cell channel layers 163. The dummy epitaxial layers 151d may be disposed below the dummy channel layers 163d. The cell epitaxial layers 151 may be in contact with the substrate 101 and the cell channel layer 163. The dummy epitaxial layer 151d may contact the substrate 101 and the dummy channel layer 163d. The dummy epitaxial layers 151d may have a shape different from that of the cell epitaxial layers 151. Sidewalls of the cell epitaxial layers 151 may each have concave grooves. On the other hand, sidewalls of the dummy epitaxial layers 151d may be inclined with respect to an upper surface of the substrate 101. Insulating layers 155 may be locally disposed between the cell epitaxial layers 151 and a lowermost gate electrode layer 131. The support insulating layers 187 may be disposed between the dummy epitaxial layers 151d and the lowermost gate electrode layer 131. The insulating layer 155 may not be formed between the dummy epitaxial layers 151d and the lowermost gate electrode layer 131 due to the support insulating layers 187. The insulating layers 155 may have a ring shape formed along a sidewall of the cell epitaxial layer 151. The insulating layers 155 may have a convex cross-section.

Heights of the cell epitaxial layers 151 in the cell array region CR may be equal to each other. Heights of the dummy epitaxial layers 151d of the plurality of dummy structures DCS in the connection region CT may be different from each other. For example, the heights of the dummy epitaxial layers 151d of the plurality of dummy structures DCS may be reduced toward an edge of the connection region CT. Thus, as vertical lengths of the dummy gate dielectric layers 161d, the dummy channel layers 163d and the insulating layers 165d of the plurality of dummy structures DCS may be increased toward an edge of the connection region CT. The vertical length indicates a length extending in a direction perpendicular to the upper surface of the substrate 101.

The cell epitaxial layers 151 and the dummy epitaxial layers 151d may be formed by a selective epitaxial growth process. The cell epitaxial layers 151 and the dummy epitaxial layers 151d may be formed of a semiconductor material such as monocrystalline silicon or the like.

The cell channel layers 163 and the dummy channel layers 163d may extend in a vertical direction while penetrating through the mold insulating layers 114 and the gate electrode layers 131. The cell channel layers 163 and the dummy channel layers 163d may be formed of a semiconductor material such as polycrystalline silicon or the like.

The cell gate dielectric layers 161 may be formed to surround outer sides of the cell channel layers 163. The cell gate dielectric layer 161 may include a tunneling layer 161a, a charge storage layer 161b, and a blocking layer 161c, sequentially disposed from an outer side surface of the cell channel layer 163. The dummy gate dielectric layers 161d may be formed to surround outer sides of the dummy channel layers 163d. The dummy gate dielectric layer 161d may have a stack structure identical or similar to that of the cell gate dielectric layer 161.

The tunneling layer 161a may include, for example, silicon oxide. The charge storage layer 161b may include, for example, silicon nitride. The blocking layer 161c may include silicon oxide ($SiO_2$), silicon nitride ($Si_3N_4$), silicon oxynitride (SiON), or a high dielectric constant material. The high dielectric constant material may be one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The cell channel layer 163 and the dummy channel layer 163d may have an empty internal space. An internal space of the cell channel layer 163 and an internal space of the dummy channel layer 163d may be filled with the insulating layer 165. The cell channel layer 163 and the dummy channel layer 163d may include a semiconductor material such as polycrystalline silicon, monocrystalline silicon, or the like.

The insulating layer 165 may include an insulating material such as silicon oxide or the like. The contact pad 167 may include a semiconductor material such as polycrystalline silicon or the like.

The stacked structure GS may be divided into a plurality of regions by a plurality of common source lines 180. Each of the plurality of divided regions may be referred to as a stacked structure GS. The plurality of common source lines 180 may be electrically connected to an impurity region 109 formed in an upper portion of the substrate 101. The impurity region 109 may include, for example, an impurity of a different conductivity type from that of an impurity of an interior of the substrate 101. The plurality of common source lines 180 may include at least one of a metal such as tungsten, copper, titanium, aluminum and the like, a doped semiconductor material, and a conductive material such as a conductive metal nitride film or the like. The plurality of common source lines 180 may be electrically insulated from the plurality of gate electrode layers 131 of the stacked structure GS. An insulating layer 182 may be disposed between the plurality of common source lines 180 and the stacked structure GS. The insulating layer 182 may include silicon oxide ($SiO_2$), silicon nitride ($Si_3N_4$), silicon oxynitride (SiON), or a combination thereof.

An insulating layer 185 may be disposed between the common source lines 180. A portion of the gate electrode layers 131 disposed in an upper portion of the stacked structure GS between one pair of common source lines 180 may respectively be divided into two regions by the insulating layer 185. In FIG. 4, two gate electrode layers 131 disposed in an upper portion of the stacked structure GS are illustrated as being divided by the insulating layer 185 by way of example.

Figure 5:
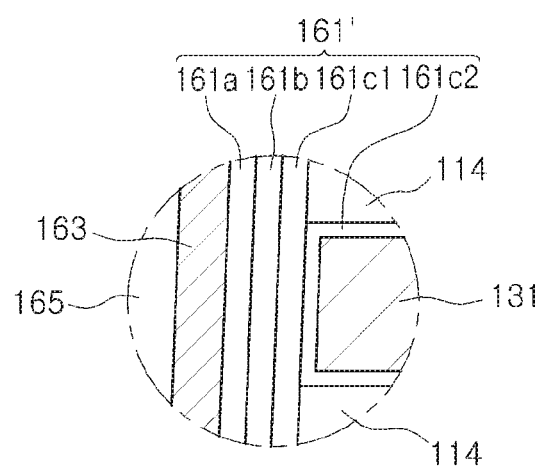
FIG. 5 is a cross-sectional view illustrating a gate dielectric layer according to some example embodiments of inventive concepts, as a region corresponding to an enlarged view of FIG. 4.

FIG. 5 is a cross-sectional view illustrating a gate dielectric layer according to some example embodiments of inventive concepts, as a region corresponding to an enlarged view of FIG. 4.

Referring to FIG. 5, a cell gate dielectric layer 161' may include a tunneling layer 161a, a charge storage layer 161b, a first blocking layer 161c1 and a second blocking layer 161c2, sequentially disposed from the cell channel layer 163.

The first blocking layer 161c1 may extend vertically in the same direction as the cell channel layer 163, and the second blocking layer 161c2 may be disposed to surround the gate electrode layer 131. For example, the first blocking layer 161c1 may be formed of a material having a lower dielectric constant than that of the second blocking layer 161c2, and the second blocking layer 161c2 may be formed of a high dielectric constant material. The first blocking layer 161c1 may be formed of silicon oxide, and the second blocking layer 161c2 may be formed of one of aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium oxide ($HfO_2$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), and praseodymium oxide ($Pr_2O_3$).

The dummy gate dielectric layer 161d may have a stacked structure identical to or similar to that of the cell gate dielectric layer 161.

Figure 6:
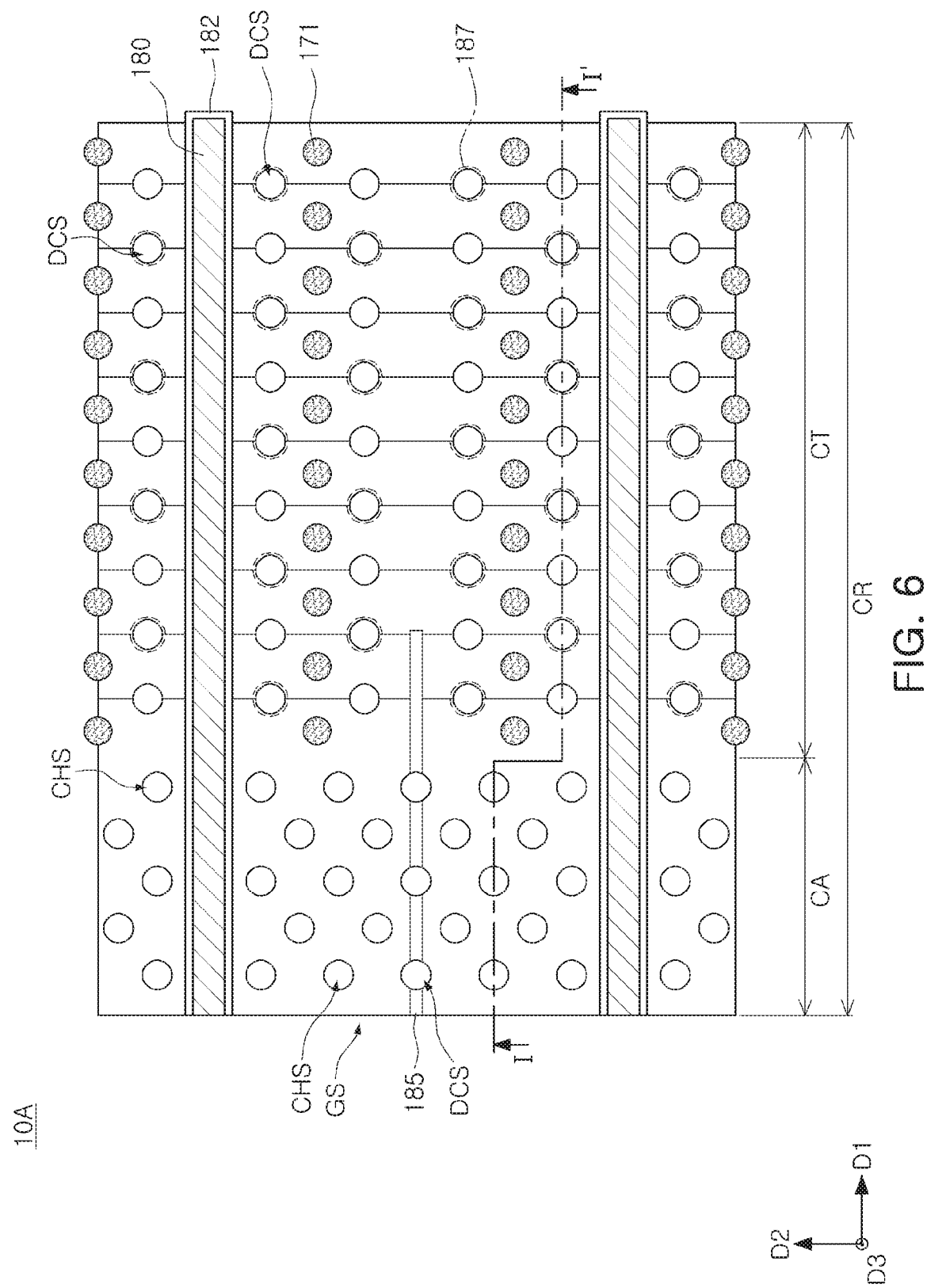
FIGS. 6 and 7 are a schematic plan view and a cross-sectional view of a vertical memory device according to some example embodiments of inventive concepts, respectively.
Figure 7:
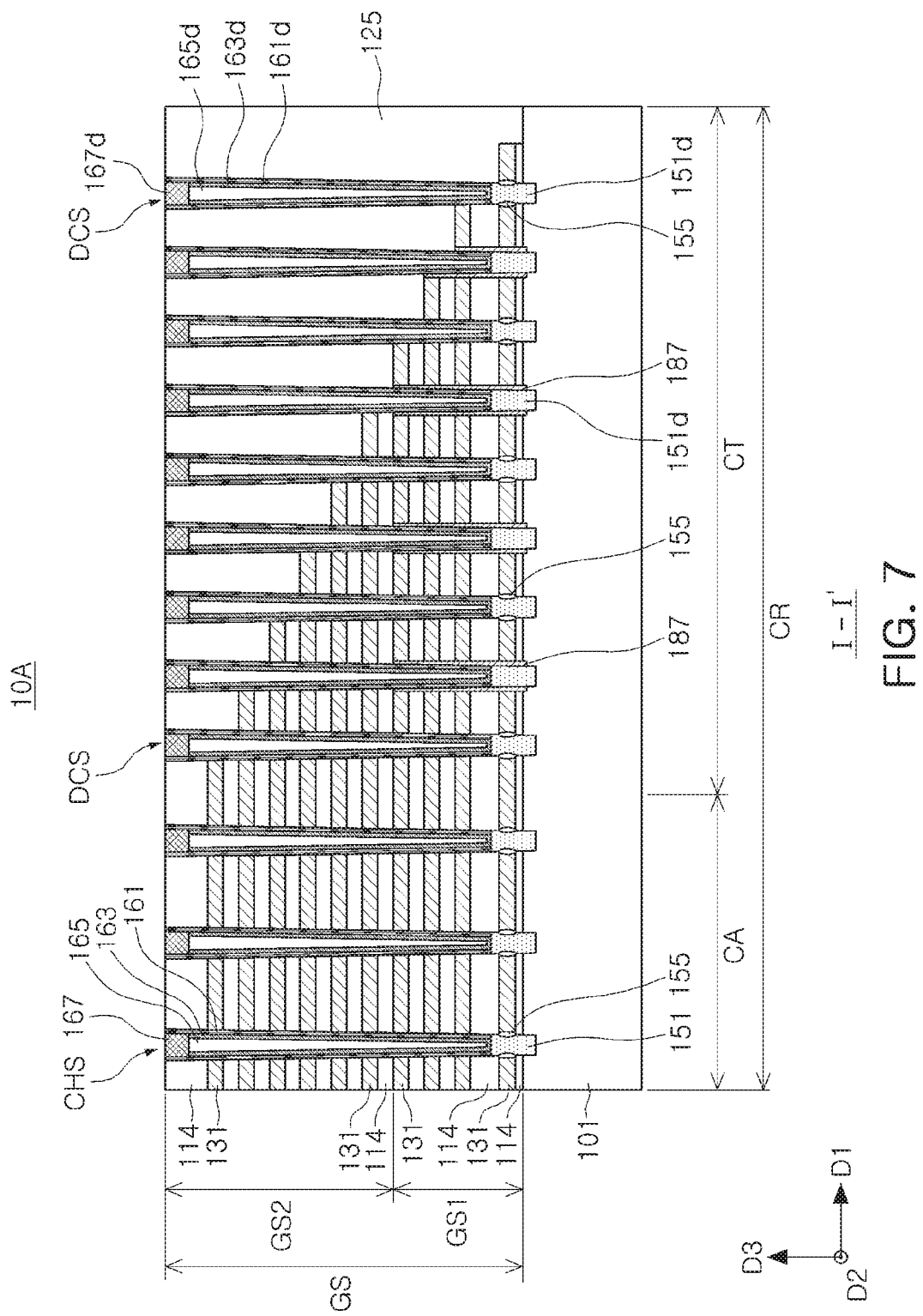

FIGS. 6 and 7 are a schematic plan view and a cross-sectional view of a vertical memory device 10A according to some example embodiments of inventive concepts, respectively.

With reference to FIGS. 6 and 7, the vertical memory device 10A will be described below with respect to characteristics different from those of the vertical memory device 10 of FIGS. 2 to 4, and repeated descriptions of the same configurations and structures will be omitted.

Referring to FIGS. 6 and 7, the number of a plurality of support insulating layers 187 may be less than the number of a plurality of dummy channel structures DCS, in the connection region CT. In the connection region CT, the plurality of support insulating layers 187 may surround outer peripheral (e.g., circumferential) surfaces of a portion of the plurality of dummy channel structures DCS. A portion of the plurality of dummy channel structures DCS may penetrate through the plurality of support insulating layers 187. The plurality of support insulating layers 187 may be disposed on a substrate 101 in zigzag arrangement in a first direction D1 and a second direction D2.

Shapes of dummy epitaxial layers 151d adjacent to each other in the first direction D1 and the second direction D2 may be different. Sidewalls of the dummy epitaxial layers 151d surrounded by the support insulating layer 187 may be inclined with respect to an upper surface of the substrate 101, and sidewalls of the dummy epitaxial layers 151d not surrounded by the support insulating layer 187 may have concave grooves. Insulating layers 155 may be disposed on the sidewalls of the dummy epitaxial layers 151d not surrounded by the support insulating layer 187.

Figure 8:
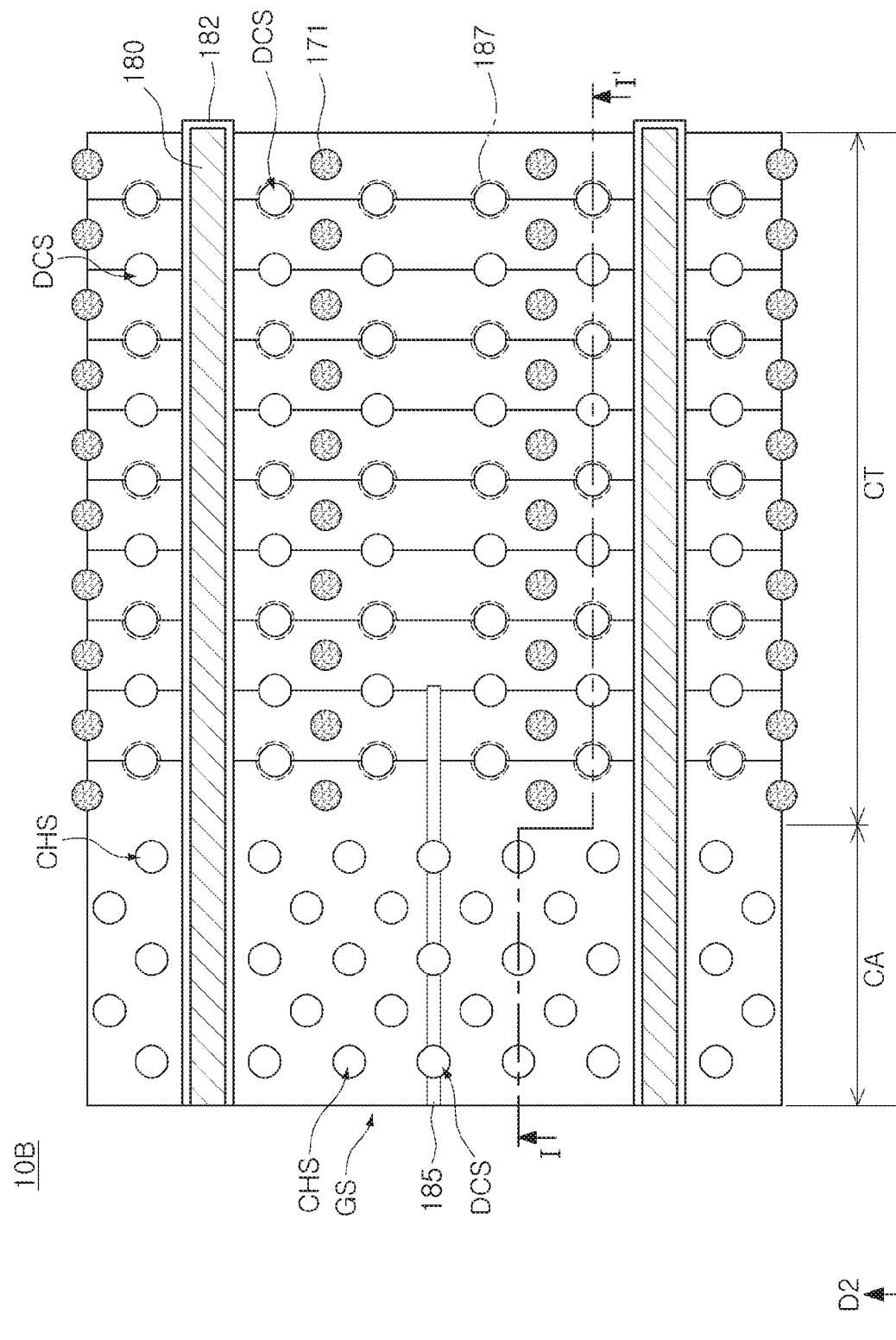
FIG. 8 is a schematic plan view of a vertical memory device according to some example embodiments of inventive concepts.

FIG. 8 is a schematic plan view of a vertical memory device 10b according to some example embodiments of inventive concepts.

With reference to FIG. 8, the vertical memory device 10B will be described below with respect to characteristics different from those of the vertical memory device 10 of FIGS. 2 to 4, and repeated descriptions of the same configurations and structures will be omitted.

Referring to FIG. 8, the number of a plurality of support insulating layers 187 may be less than the number of a plurality of dummy channel structures DCS, in the connection region CT. In the connection region CT, the plurality of support insulating layers 187 may surround outer peripheral (e.g., circumferential) surfaces of a portion of the plurality of dummy channel structures DCS. A portion of the plurality of dummy channel structures DCS may penetrate through the plurality of support insulating layers 187. The plurality of support insulating layers 187 may be disposed to have an interval therebetween greater than an interval between the plurality of dummy channel structures DCS, in the first direction D1. For example, the arrangement interval of the plurality of support insulating layers 187 may be twice the arrangement interval of the plurality of dummy channel structures DCS, in the first direction D1. In the second direction D2, the arrangement interval of the plurality of support insulating layers 187 may be the same as the arrangement interval of the plurality of dummy channel structures DCS. In addition, in a manner different from the example embodiment of FIG. 7, shapes of the dummy epitaxial layers 151d adjacent to each other in the first direction D1 may be different from each other, and shapes of the dummy epitaxial layers 151d adjacent to each other in the second direction D2 may the same as each other.

Figure 9:
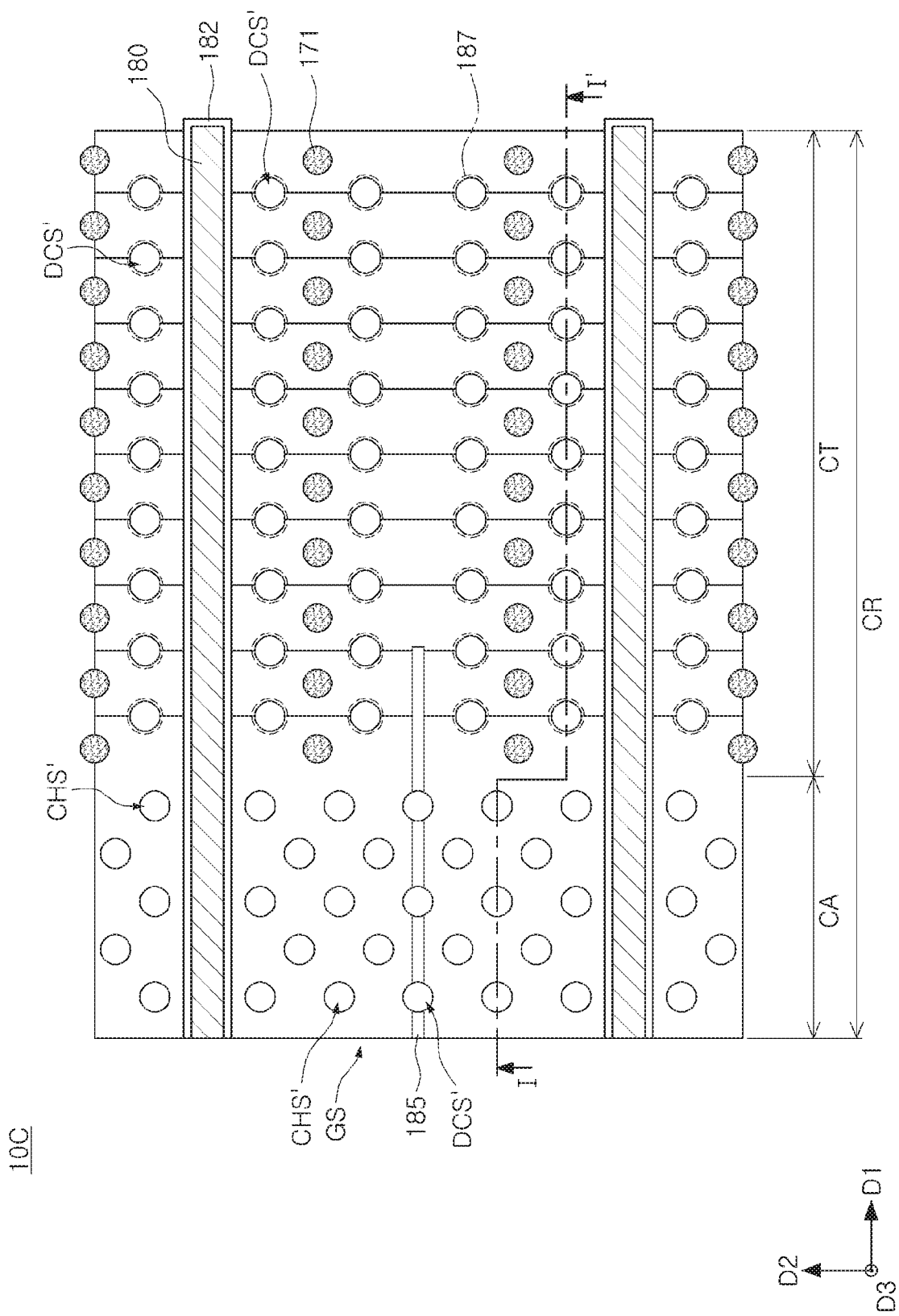
FIGS. 9 and 10 are a schematic plan view and a cross-sectional view of a vertical memory device according to some example embodiments of inventive concepts, respectively.
Figure 10:
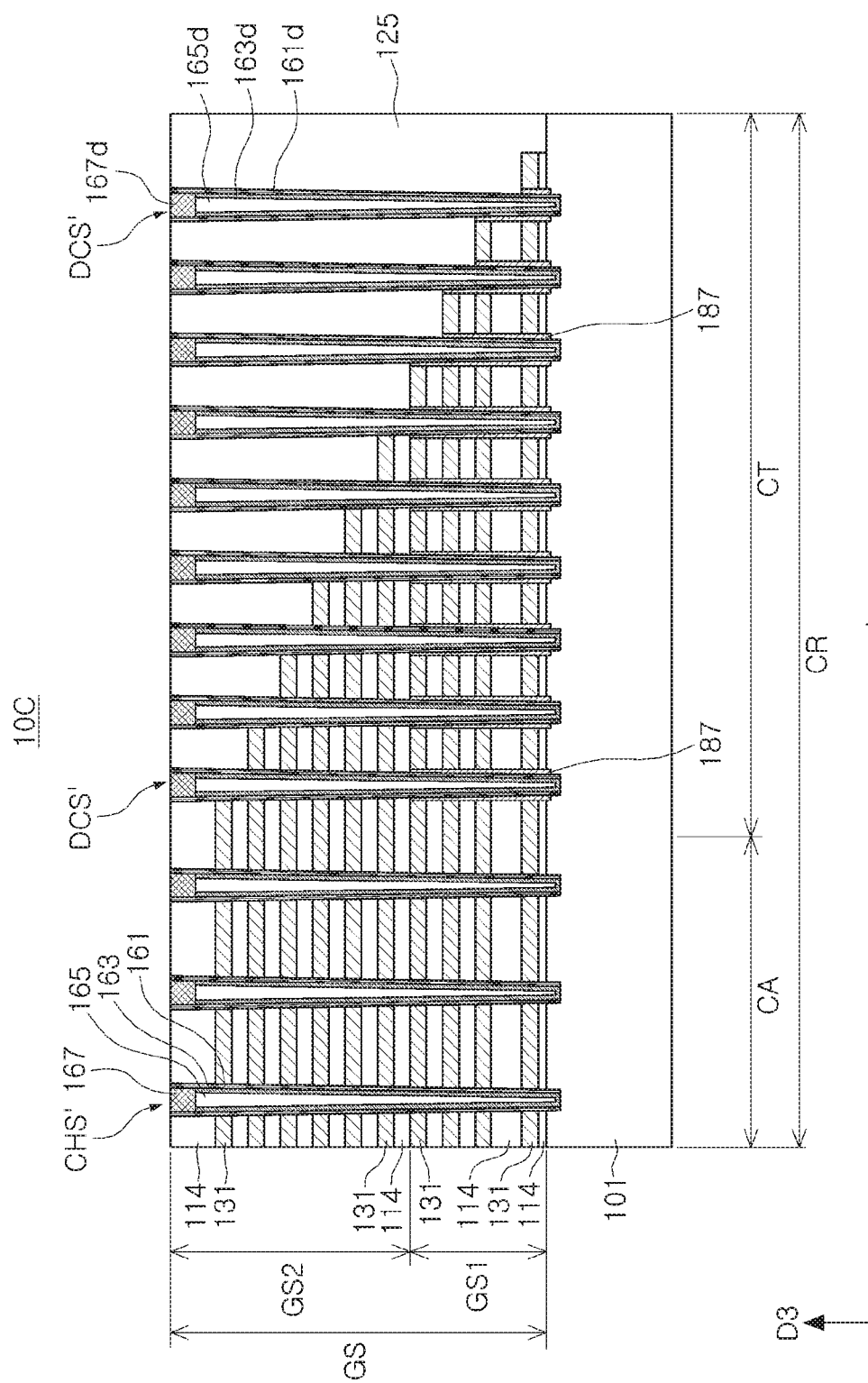

FIGS. 9 and 10 are a schematic plan view and a cross-sectional view of a vertical memory device 10C according to some example embodiments of inventive concepts, respectively.

With reference to FIGS. 9 and 10, the vertical memory device 10C will be described below with respect to characteristics different from those of the vertical memory device 10 of FIGS. 2 to 4, and repeated descriptions of the same configurations and structures will be omitted.

With reference to FIGS. 9 and 10, each of a plurality of channel structures CHS' may include a cell gate dielectric layer 161, a cell channel layer 163, an insulating layer 165, and a contact pad 167. A plurality of cell channel layers 163 of the plurality of channel structures CHS' may directly contact a substrate 101. A plurality of dummy channel structures DCS' may have a structure similar to that of the plurality of channel structures CHS'. Each of the plurality of dummy channel structures DCS' may include a dummy gate dielectric layer 161d, a dummy channel layer 163d, an insulating layer 165d, and a contact pad 167d. A plurality of dummy channel layers 163d of the plurality of dummy channel structures DCS' may directly contact the substrate 101. Lower surfaces of the plurality of dummy channel layers 163d may be positioned to be lower than lower surfaces of the plurality of support insulating layers 187.

Figure 11:
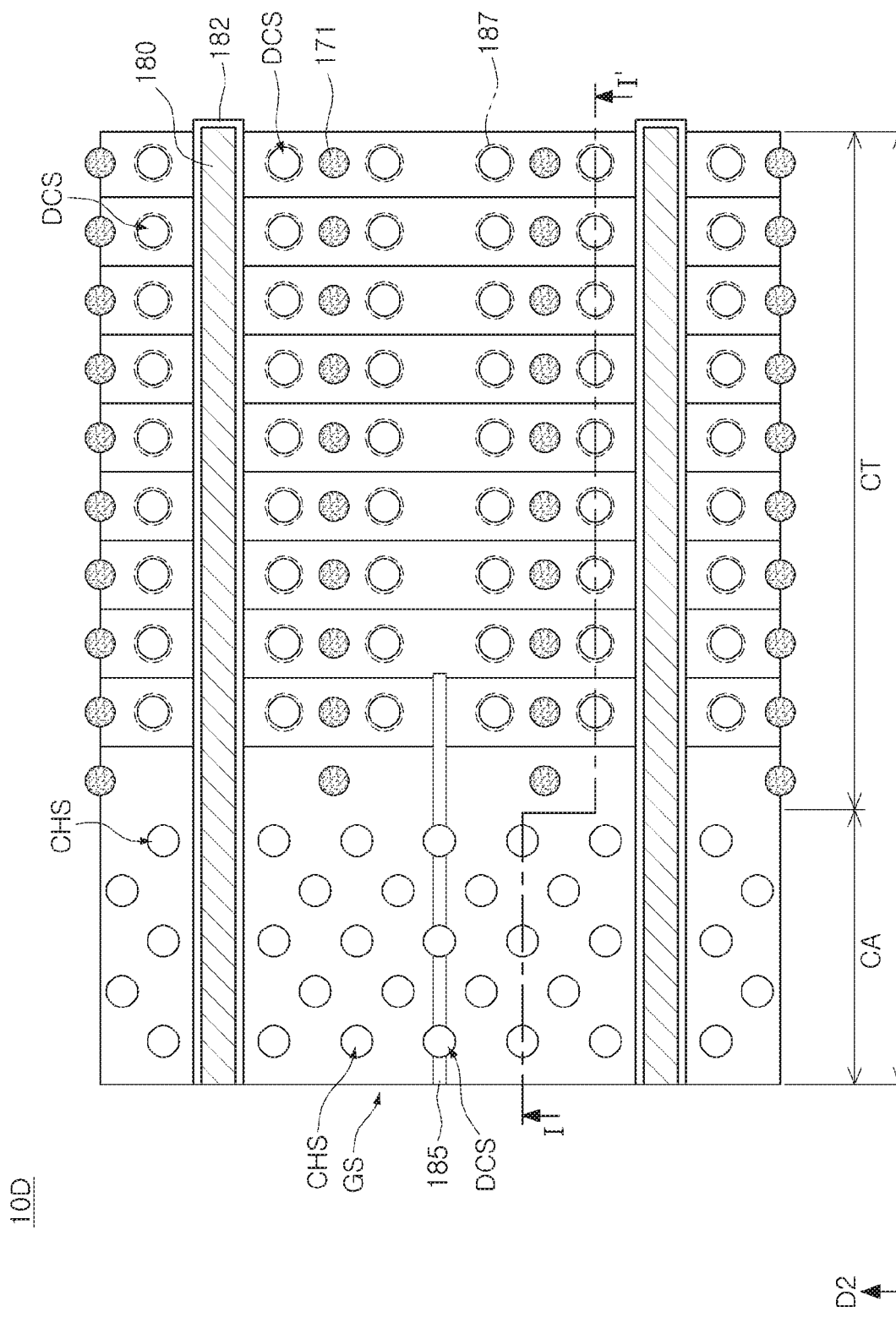
FIGS. 11 and 12 are a schematic plan view and a cross-sectional view of a vertical memory device according to some example embodiments of inventive concepts, respectively.
Figure 12:
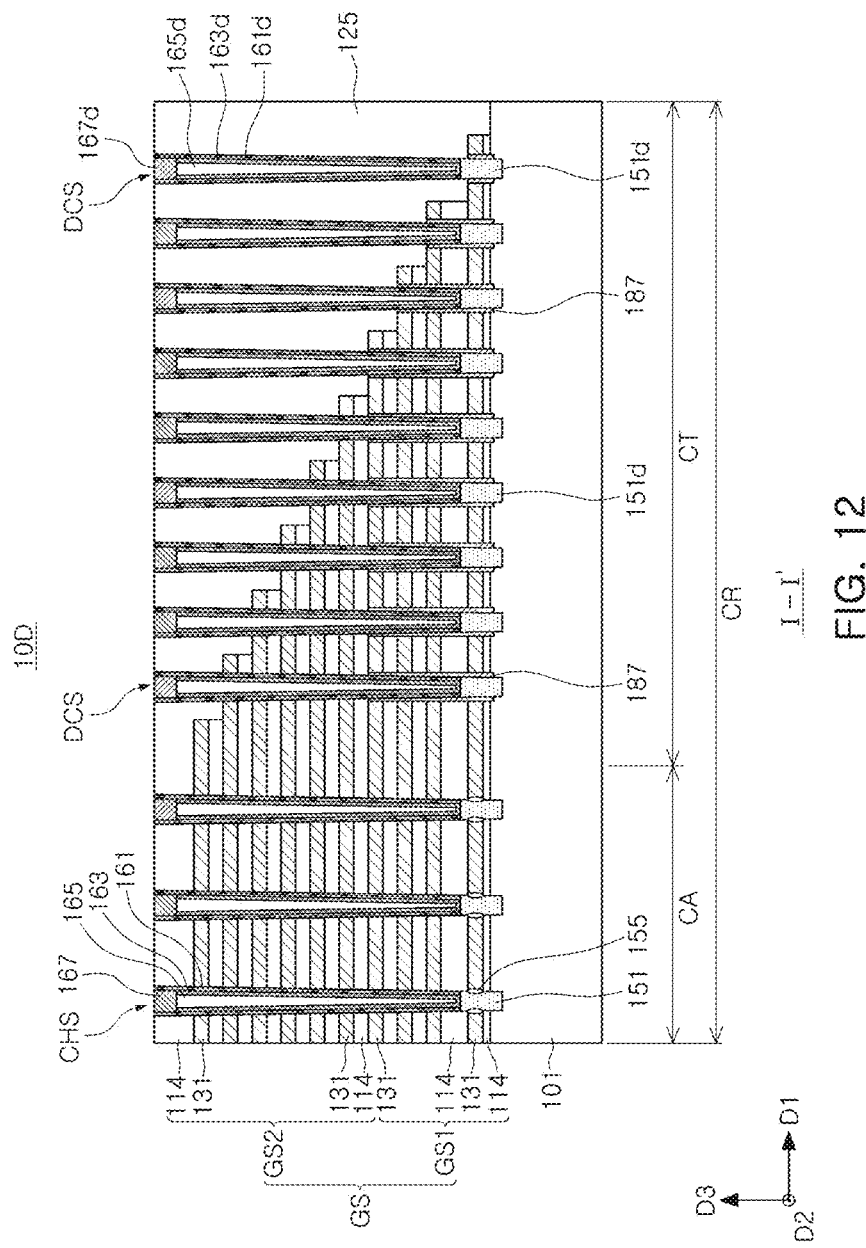

FIGS. 11 and 12 are a schematic plan view and a cross-sectional view of a vertical memory device 10D according to some example embodiments of inventive concepts, respectively.

With reference to FIGS. 11 and 12, the vertical memory device 10D will be described below with respect to characteristics different from those of the vertical memory device 10 of FIGS. 2 to 4, and repeated descriptions of the same configurations and structures will be omitted.

Referring to FIGS. 11 and 12, a plurality of dummy channel structures DCS may be disposed to be spaced apart from ends of a plurality of step layers of a stacked structure GS and penetrate through the plurality of step layers, in a connection region CT. Heights of a plurality of support insulating layers 187 disposed on an edge of the connection region CT may be lower than heights of the plurality of support insulating layers 187 adjacent to a cell array region CR. The heights of the plurality of support insulating layers 187 disposed on the edge of the connection region CT may be gradually lowered. In a manner different from that of FIG. 3, the plurality of support insulating layers 187 disposed on the edge of the connection region CT may not have portions of different heights in an upper surface of the substrate 101.

FIGS. 13 to 23 are drawings schematically illustrating main operations of a method of manufacturing a vertical memory device 10 according to some example embodiments of inventive concepts. In FIGS. 13 to 23, regions corresponding to those of FIG. 3 are illustrated.

Figure 13:
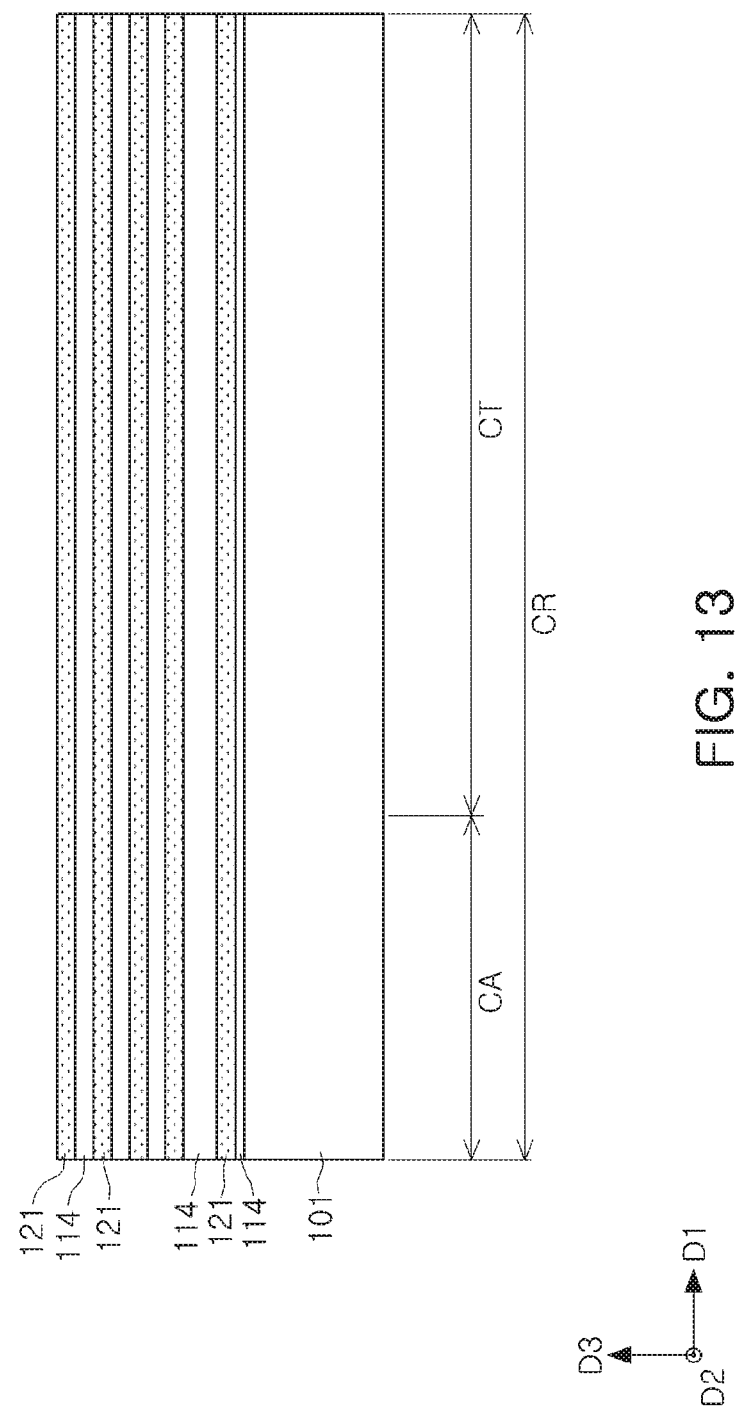
FIGS. 13 to 23 are drawings schematically illustrating main operations of a method of manufacturing a vertical memory device according to some example embodiments of inventive concepts.

Referring to FIG. 13, mold insulating layers 114 and sacrificial layers 121 may be alternately stacked on a substrate 101.

The mold insulating layer 114 may first be formed on an upper surface of the substrate 101, and then, the sacrificial layers 121 and the mold insulating layers 114 may alternately be formed. A portion of the mold insulating layers 114 may have different thicknesses. The sacrificial layer 121 may be disposed as an uppermost layer. The number of the mold insulating layers 114 and the number of the sacrificial layers 121 are not limited to those shown in FIG. 13.

The sacrificial layers 121 may be formed of a material having etch selectivity with respect to the mold insulating layers 114. For example, the mold insulating layers 114 may be formed of at least one of silicon oxide or silicon nitride, and the sacrificial layers 121 may be formed of at least one of silicon, silicon oxide, silicon carbide or silicon nitride. The sacrificial layers 121 may be formed of a different material than the mold insulating layers 114.

Figure 14:
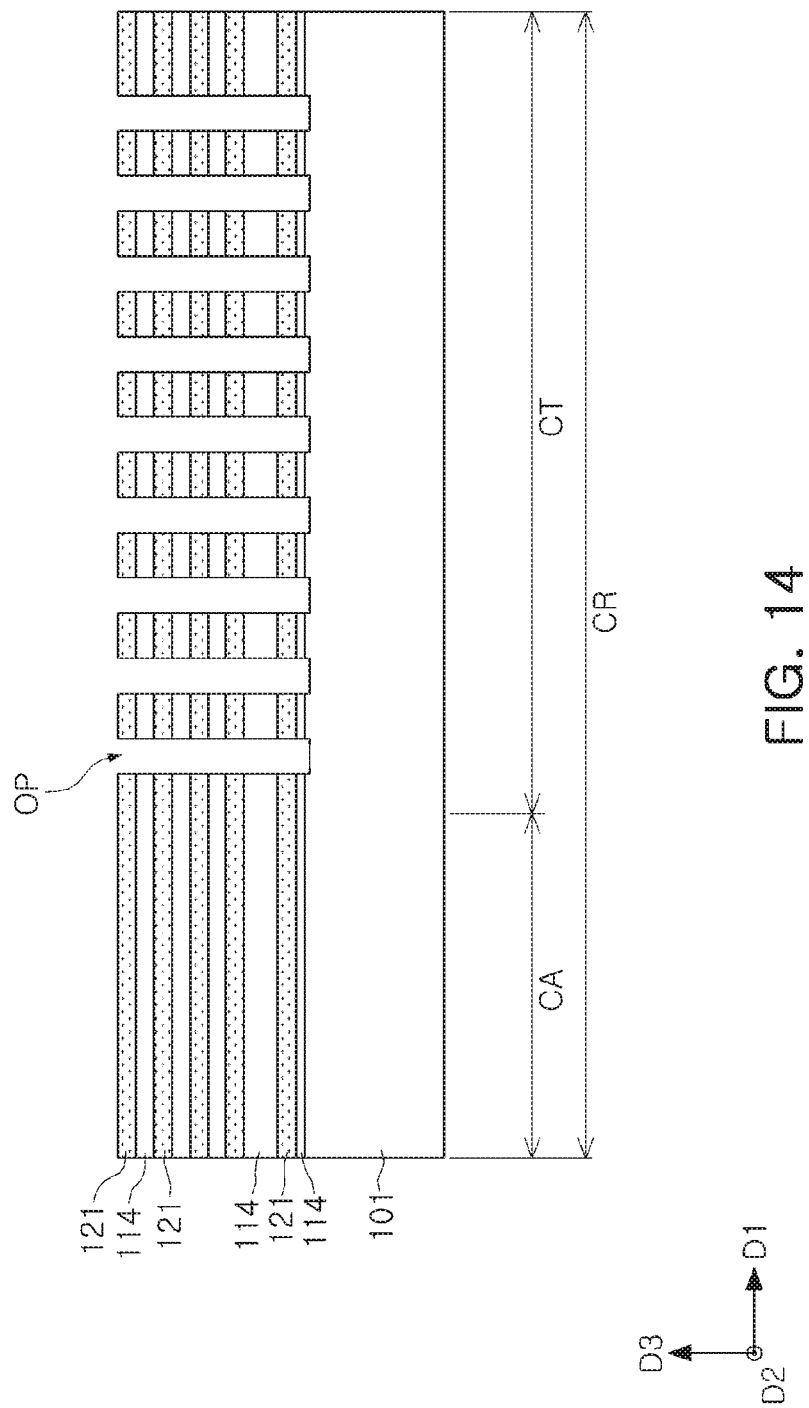

Referring to FIG. 14, openings OP penetrating through the sacrificial layers 121 and the mold insulating layers 114 may be formed in a connection region CT by a photolithography process and an anisotropic etching process. The openings OP may have, for example, a circular cross section. An upper portion of the substrate 101 may be exposed by the openings OP. Recesses may be formed in an upper portion of the substrate 101 exposed by the openings OP. Intervals between the openings OP may be the same as each other.

Figure 15:
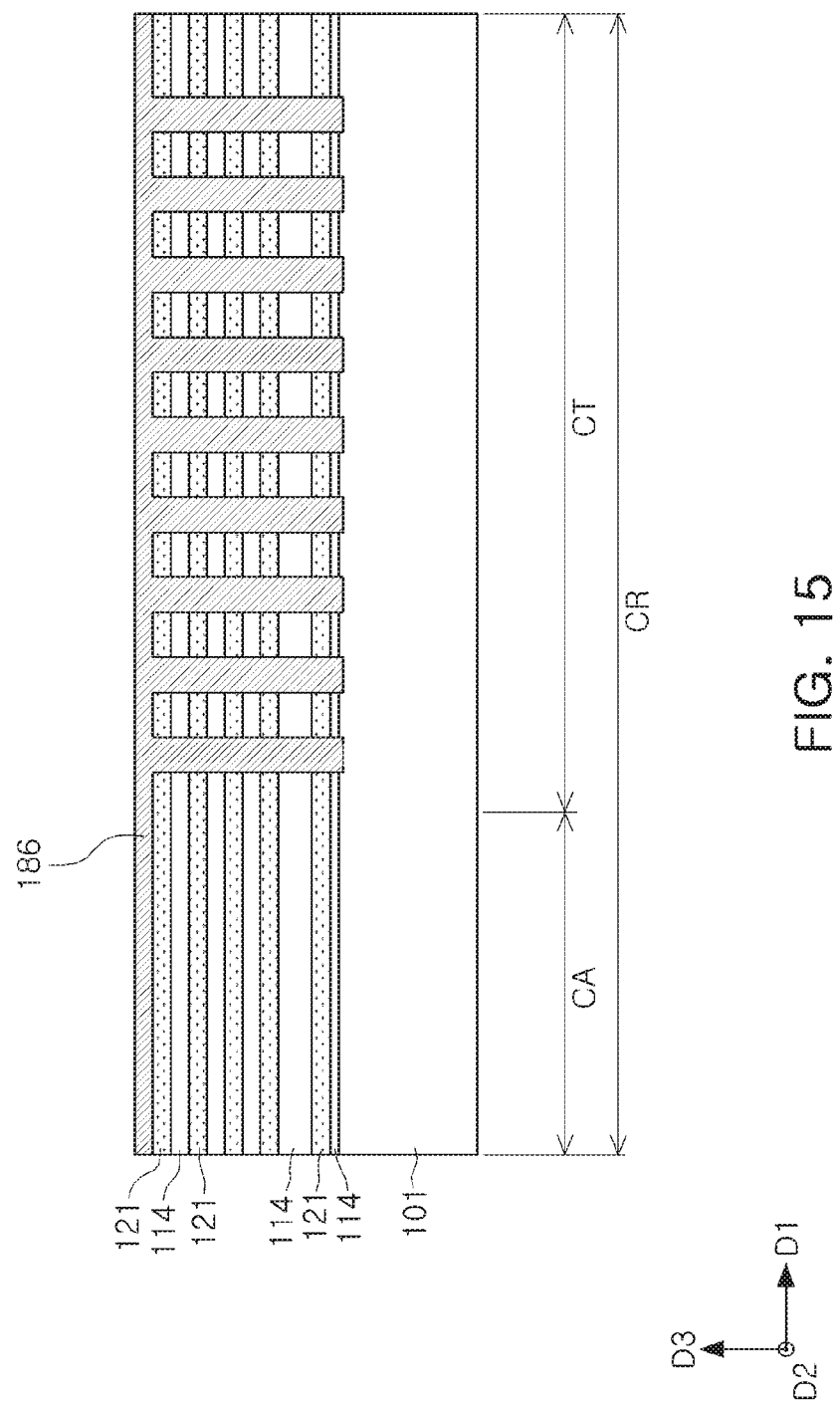

Referring to FIG. 15, an insulating layer 186 may be formed while filling the openings OP. The insulating layer 186 may also be formed on the sacrificial layer 121. The insulating layer 186 may be formed by an atomic layer deposition (ALD) process. The insulating layer 186 may include silicon oxide.

Figure 16:
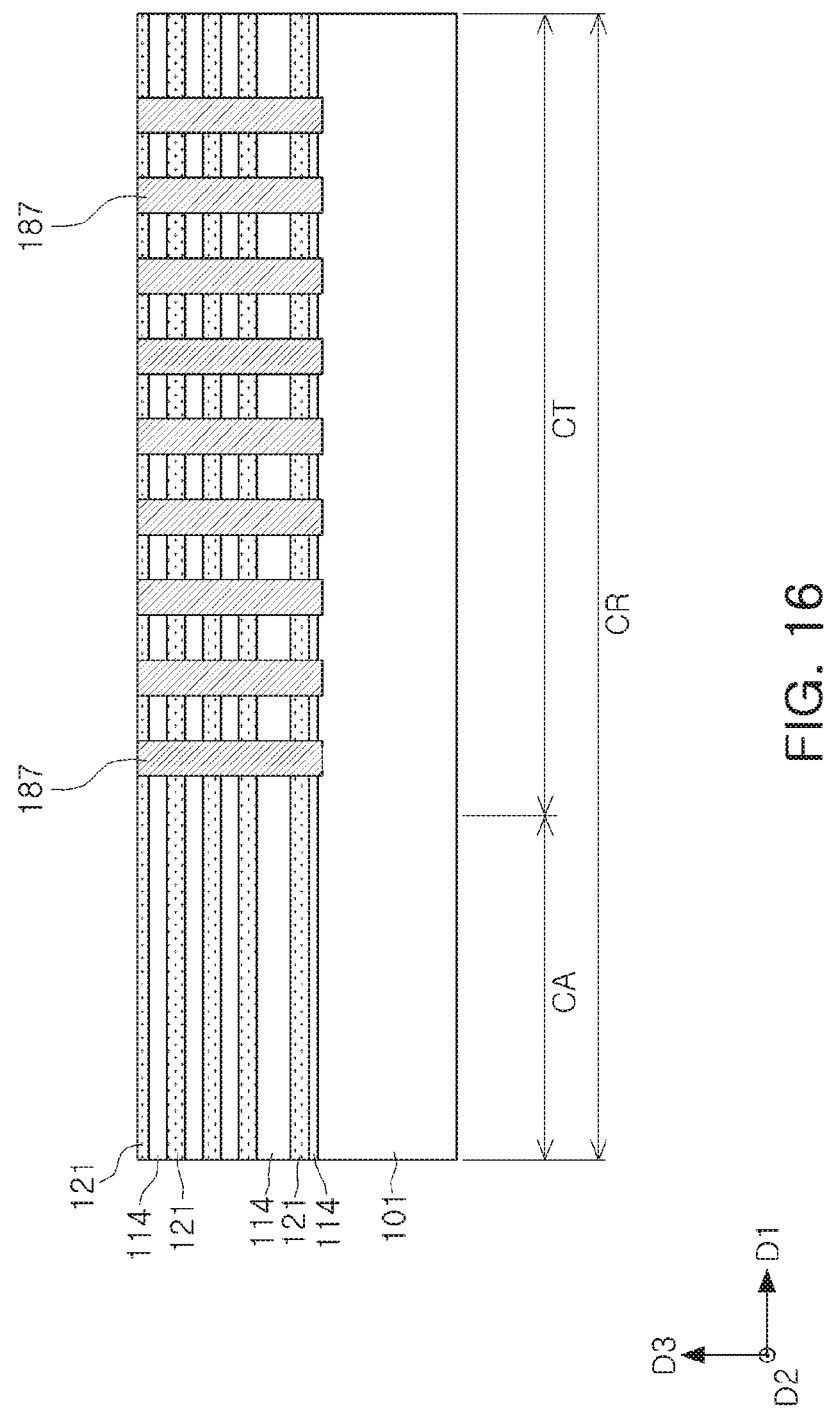

Referring to FIG. 16, the insulating layer 186 formed on the sacrificial layer 121 may be removed by a planarization process, and support insulating layers 187 may be formed to be disposed in the openings OP. The planarization process may be, for example, a chemical mechanical polishing (CMP) process. During the planarization process, a portion of the sacrificial layer 121 may be removed.

Figure 17:
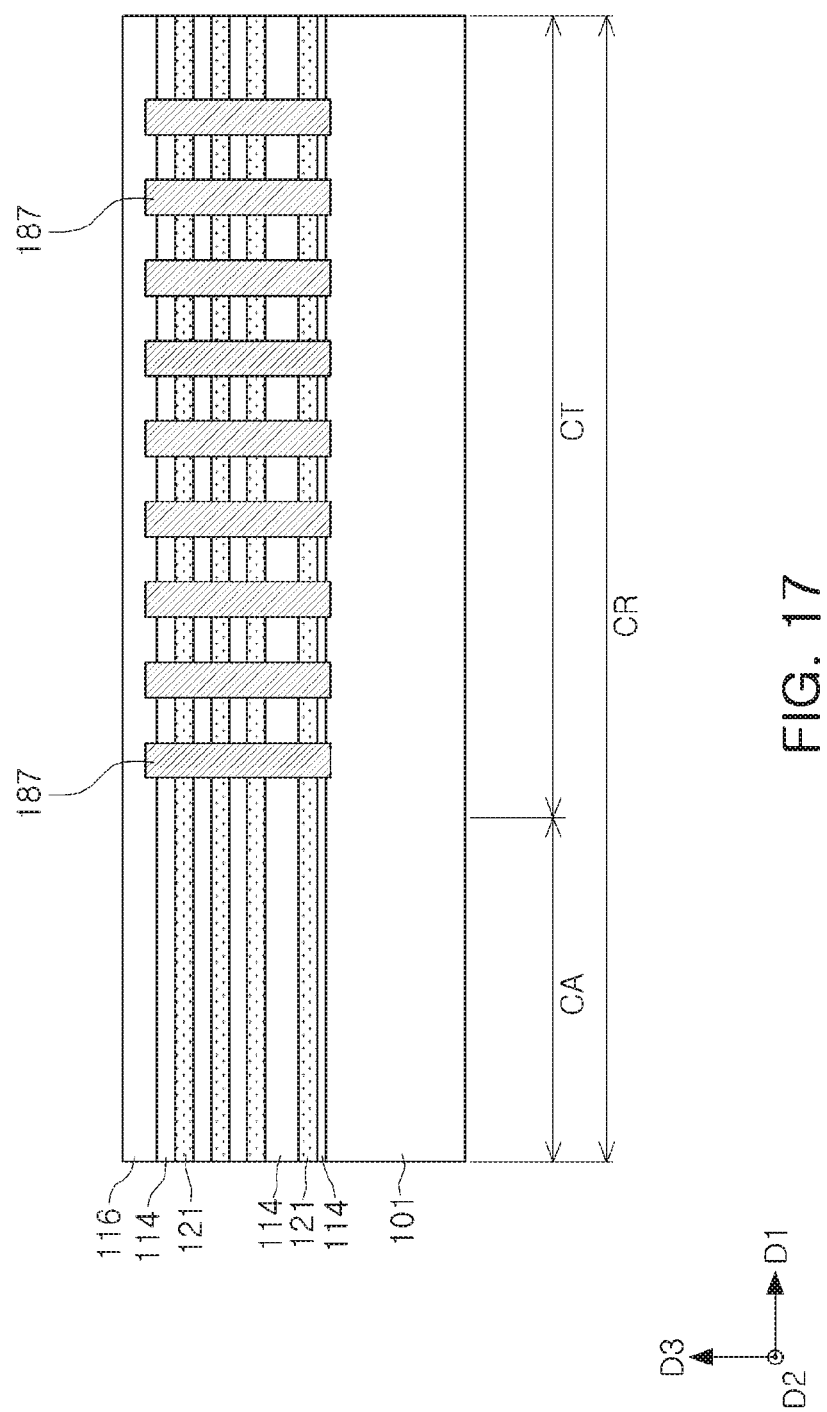

Referring to FIG. 17, an uppermost sacrificial layer 121 having been reduced in a thickness by the planarization process may be completely removed. In this case, the support insulating layers 187 may protrude above the mold insulating layer 114. Then, an insulating layer 116 covering the mold insulating layer 114 and the support insulating layers 187 may be formed. The insulating layer 116 may be formed of silicon oxide. The insulating layer 116 may be formed by a chemical vapor deposition (CVD) process using tetraethyl orthosilicate (TEOS).

Figure 18:
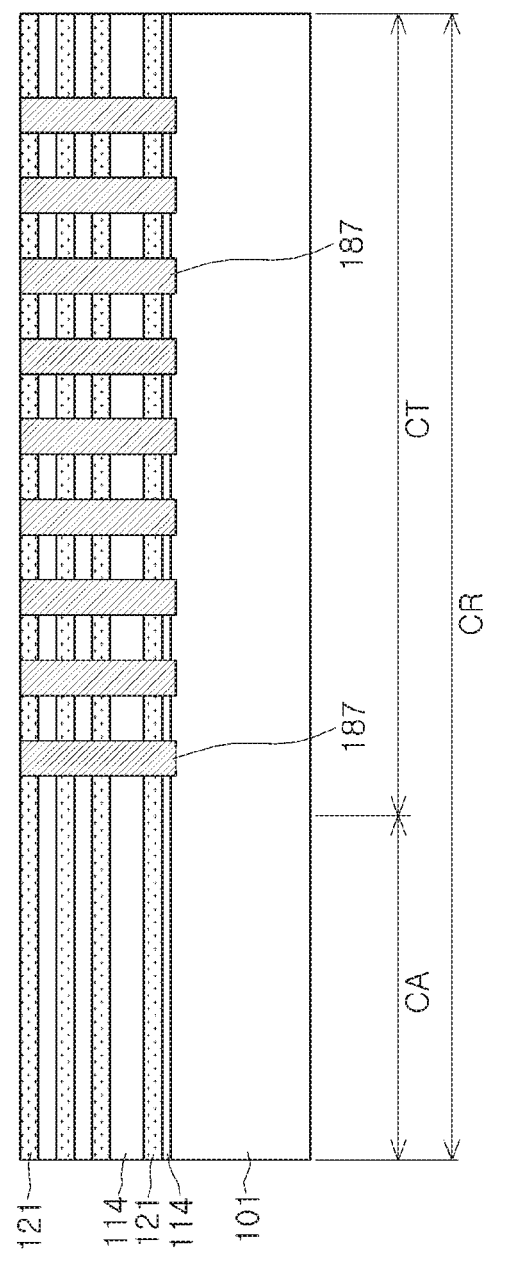

Referring to FIG. 18, the insulating layer 116 and the mold insulating layer 114 may be removed to expose the sacrificial layer 121 by the planarization process. In this case, upper surfaces of the support insulating layers 187 may be coplanar with an upper surface of the sacrificial layer 121. The planarization process may be, for example, a chemical mechanical polishing (CMP) process.

The processes described above with reference to FIGS. 13 to 18 may be variously modified in example embodiments. For example, in the process with reference to FIG. 13, the mold insulating layers 114 may be disposed in an uppermost portion, and the insulating layer 186 may be formed to fill the openings OP, through the process described above with reference to FIGS. 14 and 15. Subsequently, the insulating layer 186 formed on an uppermost mold insulating layer 114 and the uppermost mold insulating layer 114 may be removed by a chemical mechanical polishing (CMP) process to forma structure as illustrated in FIG. 18.

Figure 19:
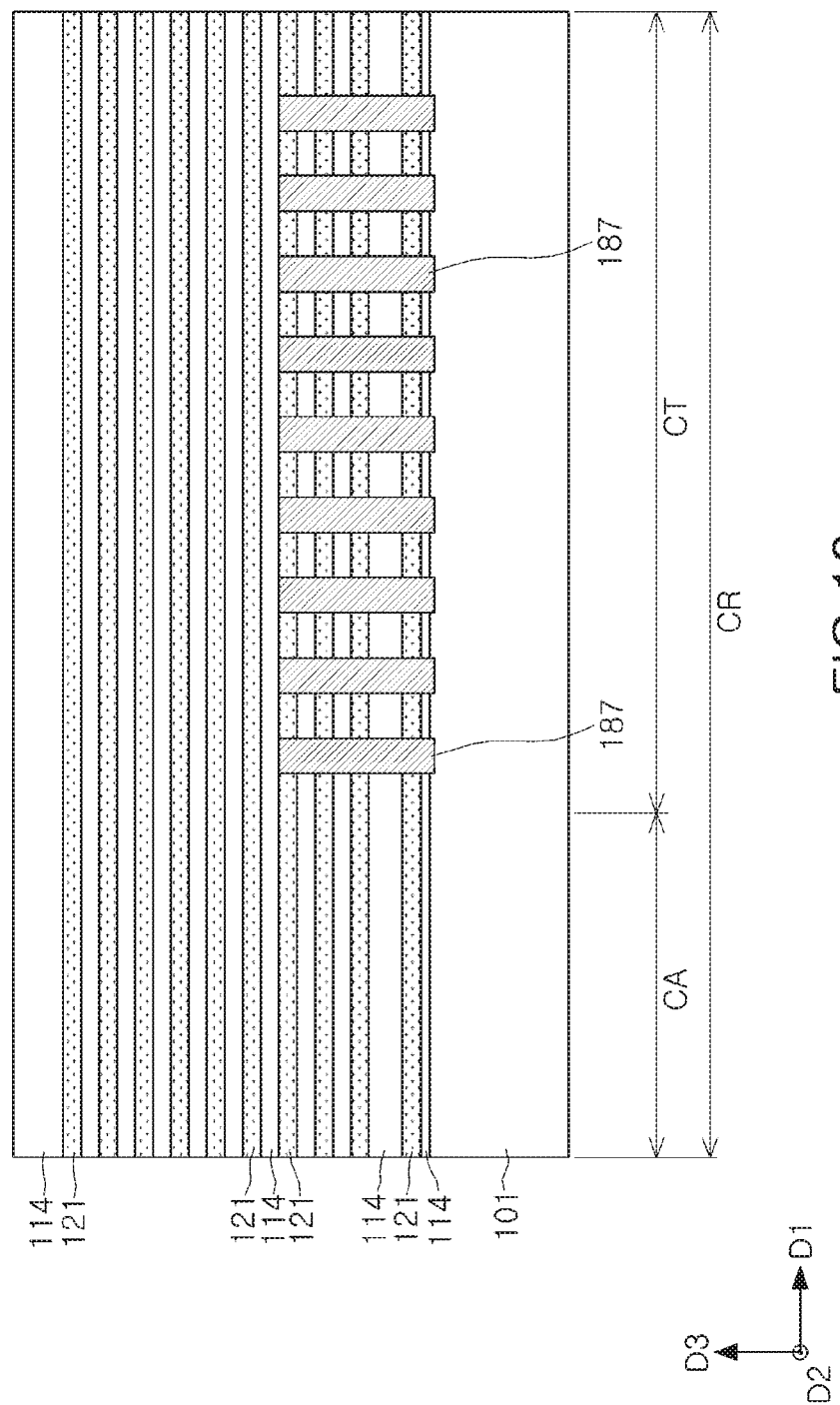

Referring to FIG. 19, mold insulating layers 114 and sacrificial layers 121 may be alternately stacked on a sacrificial layer 121 and a support insulating layer 187. In an uppermost portion, mold insulating layers 114 may be formed.

Figure 20:
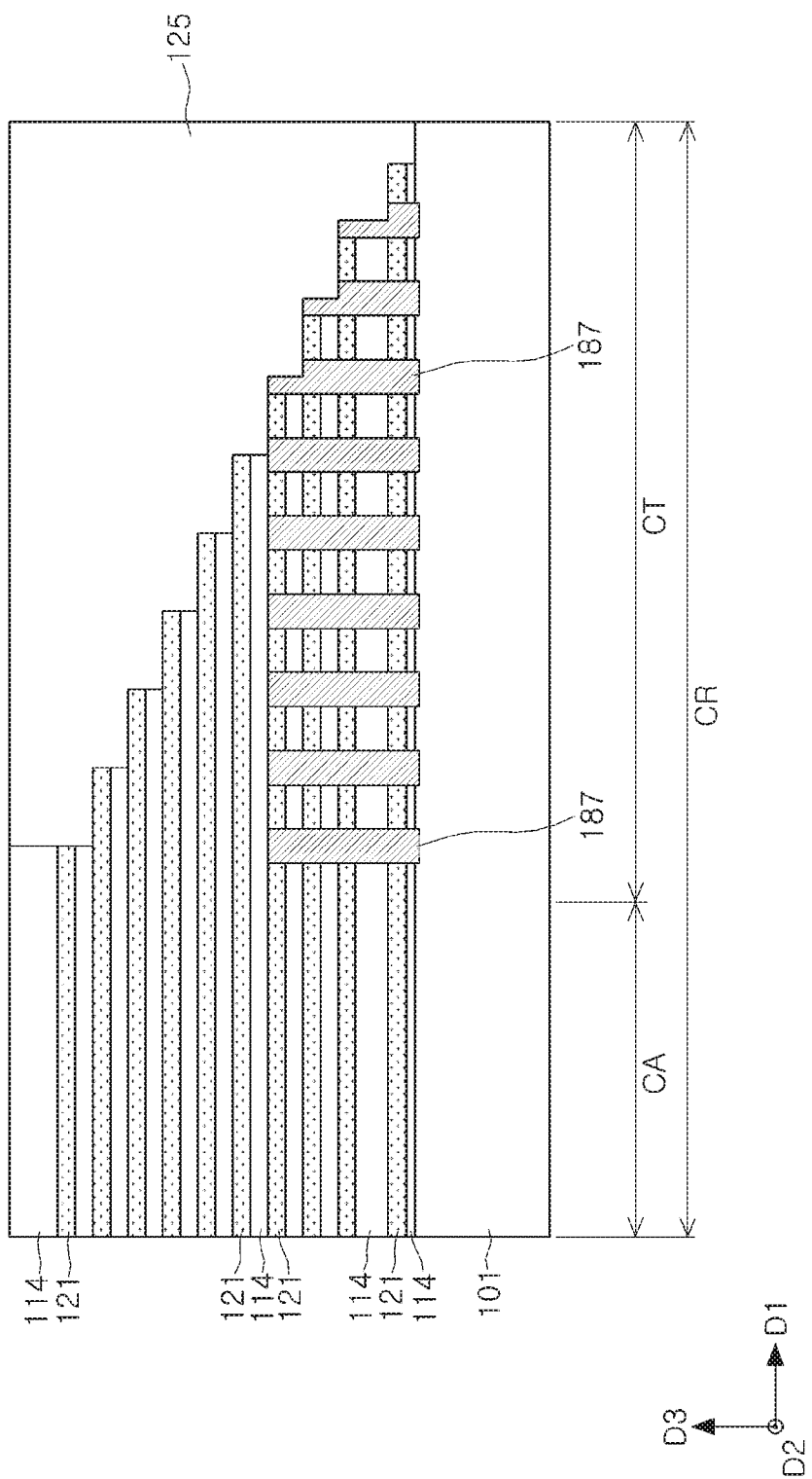

Referring to FIG. 20, the sacrificial layers 121 and the mold insulating layers 114 may be patterned in the connection region CT.

The sacrificial layers 121 and the mold insulating layers 114 may extend to have in different lengths in the connection region CT. A step structure may be formed in the connection region CT by the sacrificial layers 121 and the mold insulating layers 114.

Next, an interlayer insulating layer 125 covering the sacrificial layers 121 and the mold insulating layers 114 may be formed.

Figure 21:
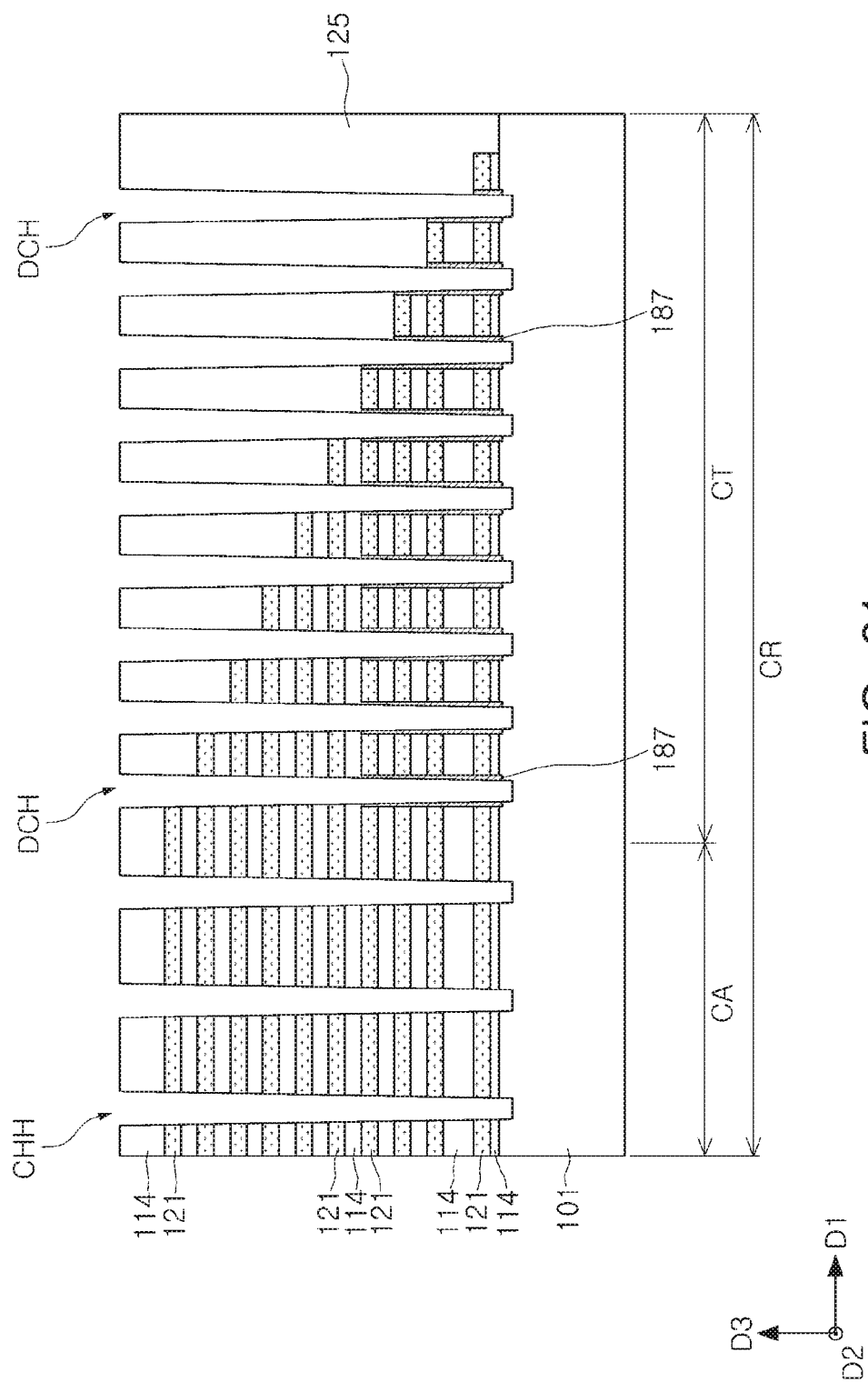

With reference to FIG. 21, cell channel holes CHH may be formed to penetrate through the sacrificial layers 121 and the mold insulating layers 114 in a cell array region CA, by an anisotropic etching process. Dummy channel holes DCH may be formed to penetrate through an interlayer insulating layer 125, the sacrificial layers 121, the mold insulating layers 114 and the support insulating layers 187, in the connection region CT. The cell channel holes CHH and the dummy channel holes DCH may extend to the substrate 101 in such a manner that recesses may be formed in the substrate 101. Lower surfaces of the recesses of the substrate 101 formed by the dummy channel holes DCH may be lower than lower surfaces of the support insulating layers 187.

Sidewalls of the cell channel holes CHH and sidewalls of the dummy channel holes DCH may be inclined with respect to an upper surface of the substrate 101. For example, diameters of the cell channel holes CHH and diameters of the dummy channel holes DCH may be reduced toward the upper surface of the substrate 101.

Figure 22:
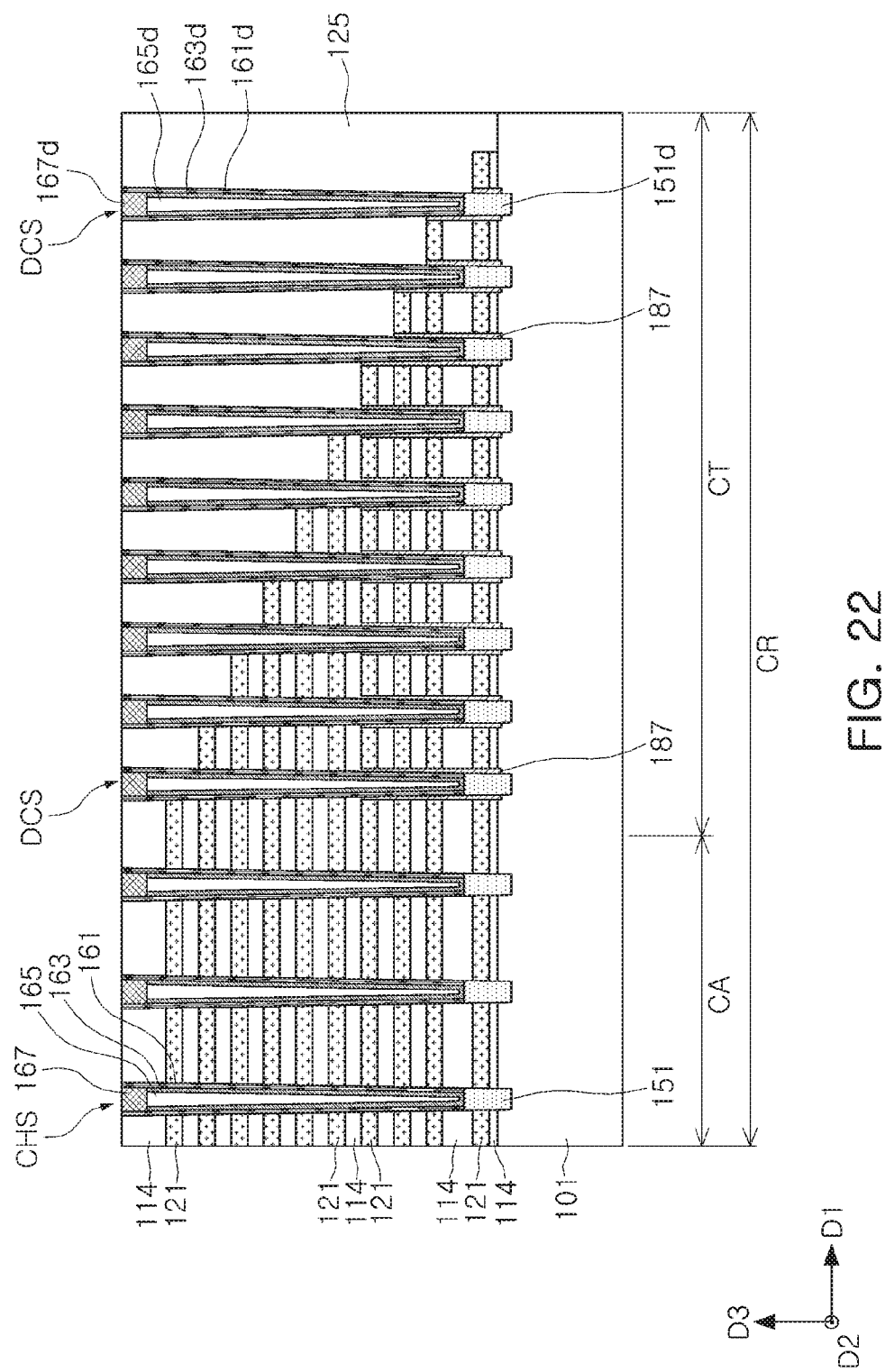

Referring to FIG. 22, channel structures CHS may be formed in the cell channel holes CHH, and dummy channel structures DCS may be formed in dummy channel holes DCH.

Cell epitaxial layers 151 may be formed below the cell channel holes CHH, and dummy epitaxial layers 151d may be formed below the dummy channel holes DCH. The cell epitaxial layers 151 and the dummy epitaxial layers 151d may be formed by selective epitaxial growth (SEG). The cell epitaxial layers 151 and the dummy epitaxial layers 151d may be formed of a semiconductor material such as silicon or the like. The cell epitaxial layers 151 and the dummy epitaxial layers 151d may be doped with an impurity. The doping of an impurity may be performed during a selective epitaxial process or by an ion implantation process after the selective epitaxial process is completed. The impurity may be, for example, an impurity of the same conductivity type as that of an impurity in the substrate 101. Upper surfaces of the cell epitaxial layers 151 and upper surfaces of the dummy epitaxial layers 151d may be formed to be higher than an upper surface of a lowermost sacrificial layer 121 adjacent to the substrate 101.

Subsequently, gate dielectric layers 161 may be formed to cover the sidewalls of the cell channel holes CHH and the sidewalls of the dummy channel holes DCH. The gate dielectric layers 161 may be formed to have a uniform thickness on the sidewalls of the cell channel holes CHH and on upper surfaces of the cell epitaxial layers 151. The gate dielectric layers 161 may be formed to have a uniform thickness on the sidewalls of the dummy channel holes DCH and on upper surfaces of the dummy epitaxial layers 151d. The gate dielectric layer 161 may include a blocking layer, a charge storage layer, and a tunneling layer sequentially formed.

Next, cell channel layers 163 may be formed in the cell channel holes CHH, and dummy channel layers 163d may be formed in the dummy channel holes DCH. Insulating layers 165 and 165d may be formed to fill remaining spaces of the cell channel holes CHH and the dummy channel holes DCH. Contact pads 167 and 167d may be formed on the cell channel layers 163 and the dummy channel layers 163d. The cell channel layers 163 and the dummy channel layers 163d may be formed of a semiconductor material such as polycrystalline silicon or amorphous silicon. The insulating layers 165 and 165d may be formed of an insulating material such as silicon oxide or the like. The contact pads 167 and 167d may be formed of a doped semiconductor material.

Figure 23:
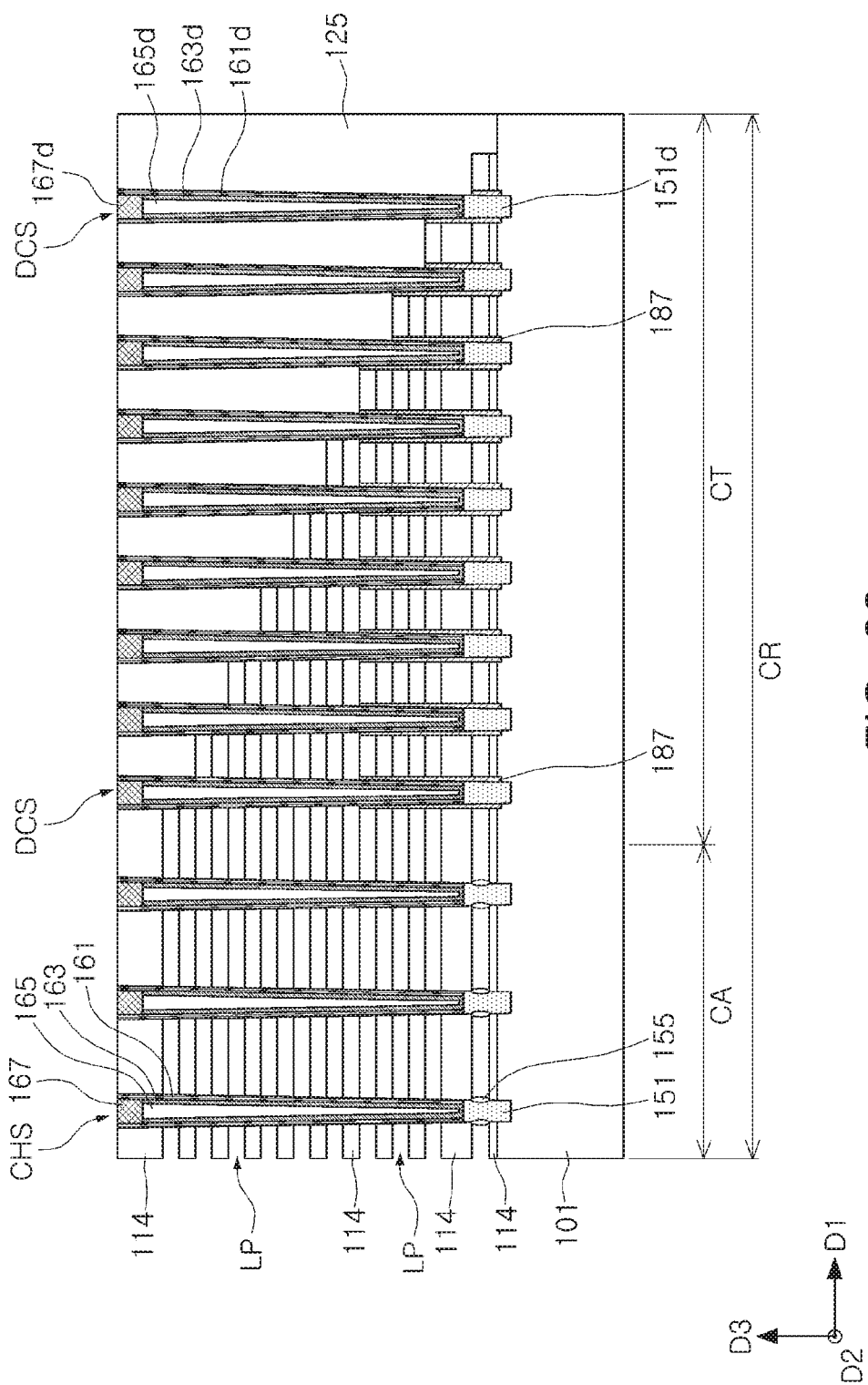

Referring to FIG. 23, the sacrificial layers 121 may be removed by a wet etching process, and thus, a plurality of side openings LP may be formed between the mold insulating layers 114. The gate dielectric layers 161, the cell epitaxial layers 151, and the support insulating layers 187 may be partially exposed through the side openings LP. For example, when the sacrificial layers 121 are formed of silicon nitride and the mold insulating layers 114 are formed of silicon oxide, the wet etching process may be performed using a phosphoric acid solution.

Then, insulating layers 155 may be formed on sidewalls of the cell epitaxial layers 151 exposed through the side openings LP. The insulating layers 155 may not be formed on sidewalls of the dummy epitaxial layers 151d due to the support insulating layers 187. The insulating layers 155 may be formed by oxidation of a portion of the cell epitaxial layers 151.

Referring again to FIG. 3, the gate electrode layers 131 may be formed in the side openings LP. The formation of the gate electrode layers 131 may include forming a metal nitride film and a metal film sequentially.

The gate electrode layers 131 may include, for example, titanium nitride (TiN) and tungsten (W).

In FIGS. 1 to 23, the vertical memory devices, in which the peripheral circuit regions PR are horizontally disposed to be adjacent to the cell region CR, have been described above. The technical idea of the present inventive concept is not limited thereto, and the peripheral circuit regions PR may be vertically disposed below the cell region CR. Alternatively, the cell region CR may also be disposed below the peripheral circuit regions PR.

Figure 24:
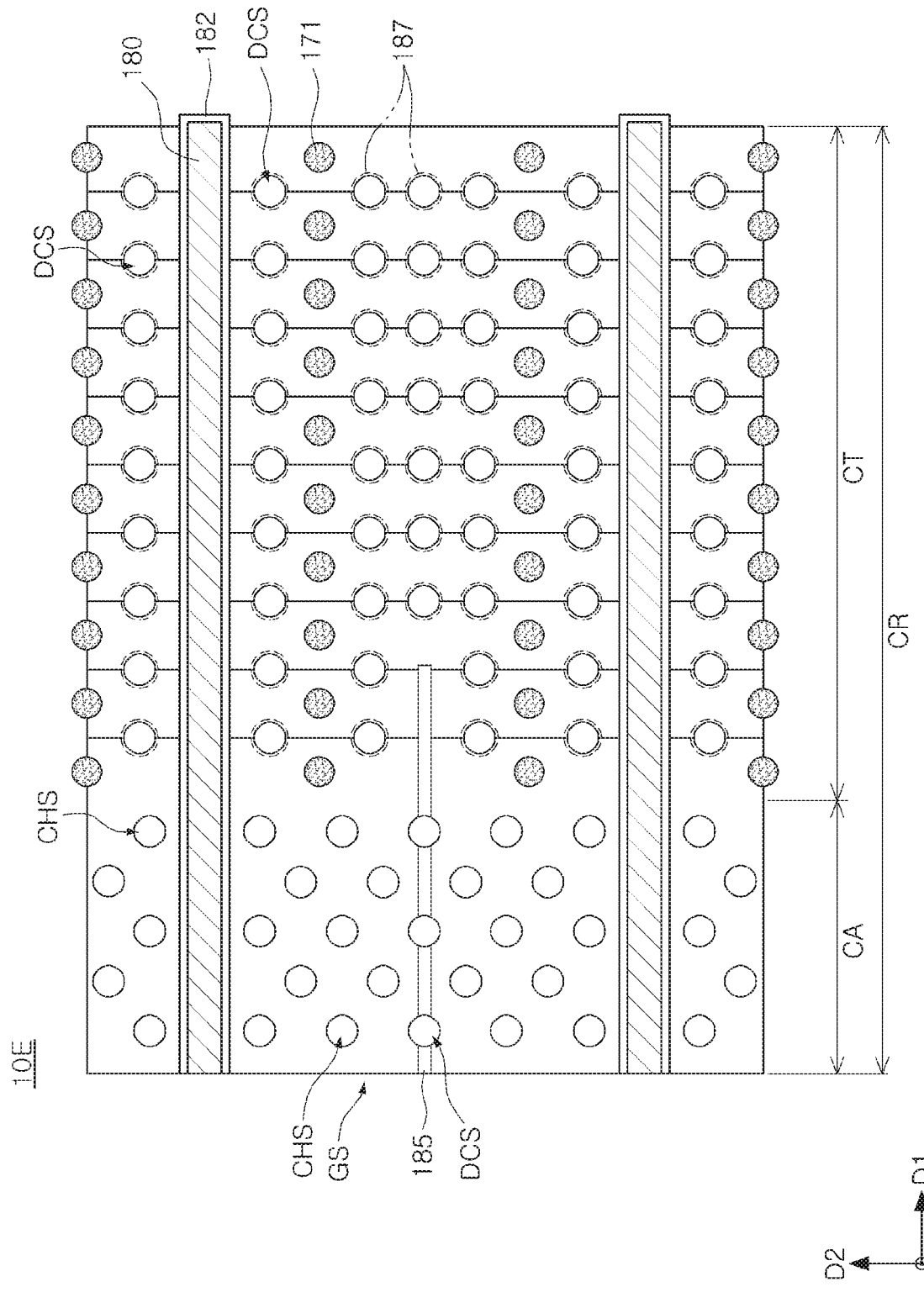
FIG. 24 is a schematic plan view of a vertical memory device according to some example embodiments of inventive concepts.

FIG. 24 is a schematic plan view of a vertical memory device according to some example embodiments of inventive concepts.

Referring to FIG. 24, the vertical memory device 10E in FIG. 24 may be the same as the vertical memory device 10 in FIG. 2, except the vertical memory device 10E may further include dummy channel structures DCS spaced apart from the insulating layer 185 in the first direction D1 over the connection region CT.

In the connection region CT, a plurality of support insulating layers 187 may be disposed in positions overlapping positions of the plurality of dummy channel structures DCS. The plurality of dummy channel structures DCS may penetrate through the plurality of support insulating layers 187, respectively, in the connection region CT.

In some example embodiments, the vertical memory devices 10A, 10B, and 10D discussed above in FIGS. 6 to 8 an 11 to 12 may be similarly modified to further include dummy channel structures DCS spaced apart from the insulating layer 185 in the first direction D1 over the connection region CT and may include support insulating layers 187 in positions overlapping those dummy channel structures DCS. The vertical memory device 10C discussed above in FIGS. 9-10 may be similarly modified to further include dummy channel structures DCS' spaced apart from the insulating layer 185 in the first direction D1 over the connection region CT and may include support insulating layers 187 in positions overlapping those dummy channel structures DCS'.

According to some example embodiments of inventive concepts, structural deformation occurring during a replacement process in which sacrificial layers are removed and gate electrode layers are formed may be limited and/or prevented.

While some example embodiments have been shown and described above, it will be apparent to those skilled in the art that modifications and variations could be made without departing from the scope of inventive concepts as defined by the appended claims.

What is claimed is:

1. A vertical memory device comprising:
    a substrate including a cell array region and a connection region adjacent to the cell array region;
    a plurality of gate electrode layers stacked on the cell array region and the connection region of the substrate, and the plurality of gate electrode layers forming a stepped structure on the connection region;
    a channel structure on the cell array region, the channel structure extending in a direction perpendicular to an upper surface of the substrate while penetrating through the plurality of gate electrode layers;
    a dummy channel structure on the connection region, the dummy channel structure extending in the direction perpendicular to the upper surface of the substrate while penetrating through at least a portion of the plurality of gate electrode layers, the dummy channel structure including a dummy gate dielectric layer defining an outer periphery of the dummy channel structure; and
    a support insulating layer between a portion of the plurality of gate electrode layers and the dummy gate dielectric layer of the dummy channel structure.

2. The vertical memory device of claim 1, wherein the support insulating layer extends from the substrate along the dummy channel structure.

3. The vertical memory device of claim 1, wherein an upper surface of the support insulating layer is coplanar with an upper surface of a part of the plurality of gate electrode layers.

4. The vertical memory device of claim 1, wherein a lower surface of the support insulating layer is lower than the upper surface of the substrate.

5. The vertical memory device of claim 1, wherein a lower surface of the dummy channel structure is lower than a lower surface of the support insulating layer.

6. The vertical memory device of claim 1, wherein the support insulating layer has an asymmetrical structure such that portions of the support insulating layer have different heights, measured from the upper surface of the substrate.

7. The vertical memory device of claim 1, wherein a diameter of the dummy channel structure is reduced toward the substrate.

8. The vertical memory device of claim 1, wherein
    the dummy channel structure includes a dummy epitaxial layer in contact with the substrate, and
    the support insulating layer is between the dummy epitaxial layer and a lowermost gate electrode layer among the plurality of gate electrode layers.

9. The vertical memory device of claim 8, wherein the channel structure includes a channel epitaxial layer in contact with the substrate, and
    the channel epitaxial layer and the dummy epitaxial layer have different shapes.

10. The vertical memory device of claim 9, wherein
    sidewall of the channel epitaxial layer includes a concave groove, and
    a sidewall of the dummy epitaxial layer is inclined with respect to the upper surface of the substrate.

11. The vertical memory device of claim 1, further comprising:
a plurality of dummy channel structures on the substrate, wherein the plurality of dummy channel structures include the dummy channel structure; and
a plurality of support insulating layers, wherein the plurality of support insulating layers include the support insulating layer and the plurality of support insulating layers surround corresponding portions of the plurality of dummy channel structures in the connection region.

12. The vertical memory device of claim 11, wherein the plurality of support insulating layers are disposed in a zigzag manner on the substrate.

13. The vertical memory device of claim 1, further comprising:
a plurality of dummy channel structures on the substrate, wherein the plurality of dummy channel structures include the dummy channel structure; and
a plurality of support insulating layers on the substrate, wherein the plurality of support insulating layers include the support insulating layer, and
a height of a one of the plurality of support insulating layers is lower than a height of other support insulating layers among the plurality of support insulating layers.

14. A vertical memory device comprising:
a substrate including a cell array region and a connection region adjacent to the cell, array region;
a lower stacked structure on the substrate, the lower stacked structure including lower mold insulating layers and lower gate electrode layers alternately stacked on the substrate;
an upper stacked structure on the lower stacked structure, the upper stacked structure including upper mold insulating layers and upper gate electrode layers alternately stacked;
a channel structure on the cell array region, the channel structure penetrating through the upper stacked structure and the lower stacked structure;
a dummy channel structure on the connection region, the dummy channel structure penetrating through the lower stacked structure, the dummy channel structure including a dummy gate dielectric layer defining an outer periphery of the dummy channel structure; and
a support insulating layer penetrating through the lower stacked structure, the support insulating layer surrounding the outer periphery of the dummy channel structure.

15. The vertical memory device of claim 14, wherein an upper surface of the support insulating layer is coplanar with an upper surface of the lower stacked structure.

16. The vertical memory device of claim 14, wherein a lower surface of the support insulating layer is lower than an upper surface of the substrate.

17. The vertical memory device of claim 14, wherein a lower surface of the dummy channel structure is lower than a lower surface of the support insulating layer.

18. The vertical memory device of claim 14, wherein the support insulating layer includes portions having, different heights from an upper surface of the substrate.

19. The vertical memory device of claim 14, wherein the channel structure includes a channel epitaxial layer in contact with the substrate, the dummy channel structure includes a dummy epitaxial layer in contact with the substrate, and
the channel epitaxial layer and the dummy epitaxial layer have different shapes.

20. A vertical memory device comprising:
a substrate including a cell array region and a connection region adjacent to the cell array region;
a channel layer on the cell array region, the channel layer extending in a direction perpendicular to an upper surface of the substrate;
a dummy channel layer on the connection region, the dummy channel layer extending in the direction perpendicular to the upper surface of the substrate;
a cell epitaxial layer between the channel layer and the substrate;
a dummy epitaxial layer between the dummy channel layer and the substrate, the dummy epitaxial layer having a shape that is different from a shape of the cell epitaxial layer; and
a support insulating layer surrounding an outer peripheral surface of the dummy epitaxial layer, and having an upper surface higher than an upper surface of the dummy epitaxial layer.

* * * * *